(12) United States Patent
St. John

(10) Patent No.: US 11,171,665 B2
(45) Date of Patent: Nov. 9, 2021

(54) DICTIONARY-BASED DATA COMPRESSION

(71) Applicant: Nyriad Limited, Cambridge (NZ)

(72) Inventor: Alexander Kingsley St. John, Cambridge (NZ)

(73) Assignee: Nyriad Limited, Cambridge (NZ)

( * ) Notice: Subject to any disclaimer, the term of this patent is extended or adjusted under 35 U.S.C. 154(b) by 0 days.

(21) Appl. No.: 16/646,135

(22) PCT Filed: Sep. 10, 2018

(86) PCT No.: PCT/NZ2018/050122
§ 371 (c)(1),
(2) Date: Mar. 10, 2020

(87) PCT Pub. No.: WO2019/050418
PCT Pub. Date: Mar. 14, 2019

(65) Prior Publication Data
US 2020/0274550 A1    Aug. 27, 2020

Related U.S. Application Data

(60) Provisional application No. 62/556,896, filed on Sep. 11, 2017, provisional application No. 62/556,909, filed on Sep. 11, 2017, provisional application No. 62/556,902, filed on Sep. 11, 2017.

(51) Int. Cl.
*H03M 7/34* (2006.01)
*H03M 7/30* (2006.01)

(52) U.S. Cl.
CPC ....... *H03M 7/3088* (2013.01); *H03M 7/6023* (2013.01)

(58) Field of Classification Search
CPC ......... H03M 13/2792; H03M 13/1515; H03M 13/271; H03M 13/2906; H03M 13/293; H03M 13/2966; H03M 13/356; H03M 13/09; H03M 13/15; H03M 13/2707; H03M 13/2936; H03M 13/4146; H03M 13/6356; H03M 13/6561; H03M 13/2909; H03M 13/2972; H03M 7/3084
USPC .............................. 341/51, 65, 67, 106, 107
See application file for complete search history.

(56) References Cited

U.S. PATENT DOCUMENTS

| 5,561,421 A | 10/1996 | Smith et al. |
| 5,864,342 A * | 1/1999 | Kajiya .................. G06T 11/001 345/418 |
| 6,057,847 A | 5/2000 | Jenkins |
| 6,667,700 B1 | 12/2003 | McCanne et al. |

(Continued)

FOREIGN PATENT DOCUMENTS

WO    2019050418 A1    3/2019

OTHER PUBLICATIONS

Foreign Communication From a Related Counterpart Application, International Search Report and Written Opinion dated Jan. 8, 2019, International Application No. PCT/NZ2018/050122 filed on Sep. 10, 2018.

(Continued)

*Primary Examiner* — Linh V Nguyen

(57) ABSTRACT

Approaches to dictionary-based data compression are disclosed, including those in which a Zbuffer is used to identify phrases that represent uncompressed data and/or to generate decompressed data by combining a set of overlapping occluded phrases.

20 Claims, 13 Drawing Sheets

(56) References Cited

U.S. PATENT DOCUMENTS

| | | | |
|---|---|---|---|
| 6,724,391 | B1 | 4/2004 | Peled et al. |
| 7,164,370 | B1 | 1/2007 | Mishra |
| 7,882,084 | B1* | 2/2011 | Amdahl .............. G06F 16/2457 |
| | | | 707/693 |
| 8,522,125 | B1 | 8/2013 | Feng et al. |
| 8,630,983 | B2 | 1/2014 | Sengupta et al. |
| 8,631,269 | B2 | 1/2014 | Vinayak et al. |
| 8,634,248 | B1 | 1/2014 | Sprouse et al. |
| 8,792,279 | B2 | 7/2014 | Li et al. |
| 8,811,085 | B2 | 8/2014 | Sprouse et al. |
| 8,924,741 | B2 | 12/2014 | Wolrich et al. |
| 9,053,131 | B2 | 6/2015 | Sengupta et al. |
| 9,075,557 | B2 | 7/2015 | Flynn et al. |
| 9,110,592 | B2 | 8/2015 | Lee et al. |
| 9,189,421 | B2 | 11/2015 | Testardi et al. |
| 9,195,542 | B2 | 11/2015 | McKelvie et al. |
| 9,213,653 | B2 | 12/2015 | Durham et al. |
| 9,223,789 | B1 | 12/2015 | Seigle et al. |
| 9,244,958 | B1 | 1/2016 | Maccanti et al. |
| 9,262,218 | B2 | 2/2016 | Bostic et al. |
| 10,244,223 | B2* | 3/2019 | Graziosi ............. H04N 13/172 |
| 10,491,240 | B1* | 11/2019 | Dupont ............... H03M 7/3046 |
| 2003/0086620 | A1* | 5/2003 | Lucco ................ G06F 8/4434 |
| | | | 382/232 |
| 2009/0198716 | A1* | 8/2009 | Howarth ............. H03M 7/3088 |
| 2010/0214137 | A1* | 8/2010 | Schneider .......... H03M 7/3086 |
| | | | 341/51 |
| 2012/0106627 | A1* | 5/2012 | Guo .................... H04N 19/543 |
| | | | 375/240.02 |
| 2013/0101017 | A1* | 4/2013 | De Vleeschauwer .. A63F 13/12 |
| | | | 375/240.02 |
| 2014/0156616 | A1 | 6/2014 | Thakkar et al. |
| 2014/0195798 | A1 | 7/2014 | Brugger et al. |
| 2014/0201541 | A1 | 7/2014 | Paul et al. |
| 2014/0266816 | A1* | 9/2014 | Litvak ................ H03M 7/3084 |
| | | | 341/51 |
| 2015/0186100 | A1* | 7/2015 | Tsai .................... H04N 19/186 |
| | | | 375/240.12 |
| 2015/0248432 | A1* | 9/2015 | Kataoka ............. H03M 7/3086 |
| | | | 707/693 |
| 2017/0064330 | A1* | 3/2017 | Li ......................... H04N 19/50 |

OTHER PUBLICATIONS

Curry, Matthew L. 2010. "A Highly Reliable GPU-Based Raid System". Ph.D., University of Alabama at Birmingham.

Sun, Weibin, Robert Ricci, and Matthew L. Curry. "GPUstore." In Proceedings of the 5th Annual International Systems and Storage Conference on—SYSTOR '12. ACM Press, 2012.

Bhaskar, Raghav, Pradeep K. Dubey, Vijay Kumar, and Atri Rudra. "Efficient Galois Field Arithmetic on SIMD Architectures." In Proceedings of the Fifteenth Annual ACM Symposium on Parallel Algorithms and Architectures—SPAA '03. ACM Press, 2003.

* cited by examiner

```
              Red       Green     Blue      Alpha
501 ~~ 00111011  11100010  01010100  00000000
502 ~~ 00101011  11110010  01010000  00000000
503 ~~ 00100010  01100001  01010101  00000000
504 ~~ 00101010  01110001  01010101  00000000
505 ~~ 00100010  01100000  11011100  00000000

```
              Red       Green     Blue      Alpha
501 ~~ 00111011  11100010  01010100  00000000
502 ~~ 00101011  11110010  01010000  00000000
503 ~~ 00100010  01100001  01010101  00000000
504 ~~ 00101010  01110001  01010101  00000000
505 ~~ 00100010  01100000  11011100  00000000

```
              Red       Green     Blue      Alpha
501 ~~ 00111011  11100010  01010100  00000000
502 ~~ 00101011  11110010  01010000  00000000
503 ~~ 00100010  01100001  01010101  00000000
504 ~~ 00101010  01110001  01010101  00000000
505 ~~ 00100010  01100000  11011100  00000000

721 ~~ ********  ********  *101****  00000000
                              |         |
                             711       712
```

FIG. 7 ial Application No. 62/556,902 filed on Sep. 11,
DICTIONARY-BASED DATA COMPRESSION

CROSS-REFERENCE TO RELATED APPLICATIONS

The present application is a filing under 35 U.S.C. 371 as the National Stage of International Application No. PCT/NZ2018/050122, filed Sep. 10, 2018, entitled "DICTIONARY-BASED DATA COMPRESSION," which claims priority to U.S. Provisional Application No. 62/556,896 filed on Sep. 11, 2017, as well as U.S. Provisional Application No. 62/556,909 filed on Sep. 11, 2017, as well as U.S. Provisional Application No. 62/556,902 filed on Sep. 11, 2017, all of which are incorporated herein by reference in their entirety for all purposes.

FIELD

The present invention relates to dictionary-based data compression, and in particular, to a dictionary-based data compression approach suitable for a parallel compute environment.

BACKGROUND

In dictionary-based data compression and decompression, a primary task is to break the input data stream into patterns (also called phrases) whose corresponding symbols (also called codewords) have the smallest total bit-length and thus compress the data stream.

Traditionally, a dictionary-based compression system takes an input data stream, partitions it into ordered non-overlapping phrases, and encodes the phrases with a unique codeword from the dictionary. The compressed data stream containing the ordered codewords may be further compressed via some form of entropy encoding such as arithmetic encoding and is stored or transmitted and may be later decompressed. The dictionary-based decompression system takes the compressed data stream, and after entropy decoding, decodes each codeword by looking up the codeword in the dictionary, or a copy of the dictionary, to find the matching phrase. Each matching phrase is added to the output stream in series to produce the decompressed result. The output data stream is the ordered non-overlapping decoded phrases, which in a lossless system with no errors corresponds to the input data stream.

However, traditional dictionary-based compression techniques have been constrained due to the computational complexity involved and the serial nature of such techniques.

It is an object to provide an alternative approach to data compression which overcomes or at least ameliorates some or all of the disadvantages of prior data compression techniques, or to at least provides the public or industry with a useful choice.

SUMMARY

In a first example embodiment, there is provided an apparatus for compressing data, the apparatus comprising:
 a processor;
 memory associated with the processor; and
 a Zbuffer;
 wherein the Zbuffer is used to identify phrases that represent uncompressed data.
Preferably, one or more phrases are overlapping occluded phrases.

Preferably, the lowest ranking overlapping occluded phrase is preassigned.

Preferably, a plurality of lowest-ranking overlapping occluded phrases are preassigned, the Zbuffer is used to identify phrases that represent the uncompressed data, and the resulting phrases are accessed to identify the phrases that best compress the data.

Preferably, the apparatus further comprises a stencil buffer, wherein the stencil buffer is used in conjunction with the Zbuffer to store wildcard phrases within an occluding phrase.

Preferably, during processing the Zbuffer and stencil buffer interact such that where wildcards exist in a phrase, data of the phrase from a lower depth of the Zbuffer passes through.

Preferably, the phrases are obtained from a dictionary.

Preferably, the phrases are generated by the apparatus from the data.

Preferably, the phrases are for insertion into a compression dictionary.

Preferably, if an identified phrase is not in the compression dictionary, the phrase is added to the compression dictionary.

Preferably, a phrase is represented as a function.

Preferably, the function is referenced by a label and the function takes parameters, and wherein the phrase is represented by the label and parameters.

Preferably, a phrase is represented by a hash code, the hash code corresponding to a plurality of functions.

Preferably, the Zbuffer is used to encode uncompressed data based on one or more identified phrases.

In a second example embodiment, there is provided a method apparatus for compressing data, the method comprising:
 using a Zbuffer to identify phrases that represent uncompressed data.

Preferably, one or more phrases are overlapping occluded phrases.

Preferably, the lowest ranking overlapping occluded phrase is preassigned.

Preferably, a plurality of lowest-ranking overlapping occluded phrases are preassigned, the method further comprising:
 using the Zbuffer to identify phrases that represent the uncompressed data; and
 accessing the resulting phrases to identify the phrases that best compress the data.

Preferably, the method further comprises: using a stencil buffer in conjunction with the Zbuffer to store wildcard phrases within an occluding phrase.

Preferably, during processing the Zbuffer and stencil buffer interact such that where wildcards exist in a phrase, data of the phrase from a lower depth of the Zbuffer passes through.

Preferably, the method further comprises: obtaining the phrases from a dictionary.

Preferably, the method further comprises: generating the phrases from the data.

Preferably, the phrases are for insertion into a compression dictionary.

Preferably, the method further comprises:
 determining that an identified phrase is not in the compression dictionary; and
 adding the phrase to the compression dictionary.

Preferably, a phrase is represented as a function.

Preferably, the function is referenced by a label and the function takes parameters, and wherein the phrase is represented by the label and parameters.

Preferably, a phrase is represented by a hash code, the hash code corresponding to a plurality of functions.

Preferably, the method further comprises: using the Zbuffer to encode uncompressed data based on one or more of the identified phrases.

In a third example embodiment, there is provided an apparatus for decompressing compressed data comprising:
a processor;
memory associated with the processor; and
a Zbuffer;
wherein the Zbuffer is used to generate decompressed data by combining a set of overlapping occluded phrases.

Preferably, the phrases are overlapping occluded phrases.

Preferably, the apparatus further comprises a stencil buffer, wherein the stencil buffer is used in conjunction with the Zbuffer to store wildcard phrases within an occluding phrase.

Preferably, during decompression the Zbuffer and stencil buffer interact such that, where wildcard phrases exist in a phrase, data of the phrase from a lower depth of the Zbuffer passes through.

Preferably, the compressed data contains codewords and the phrases are obtained by looking up the codewords in a dictionary.

Preferably, the codewords in the dictionary contain multiple phrases, and wherein the compressed data contains one or more checksums.

Preferably, the processor is configured to decompress the compressed data in parallel using each phrase, calculate a checksum associated with the decompression, compare the calculated checksum to the checksum contained in the compressed data, and determine which phase to use based on the comparison.

Preferably, the processor is programmed to decompress the compressed data by executing one or more functions.

Preferably, a function is referenced by a label and the function takes parameters, and wherein the compressed data contains the label and parameters.

In a fourth example embodiment, there is provided a method for decompressing compressed data comprising:
using a Zbuffer to generate decompressed data by combining a set of overlapping occluded phrases.

Preferably, the phrases are overlapping occluded phrases.

Preferably, the method further comprises: using a stencil buffer in conjunction with the Zbuffer to store wildcard phrases within an occluding phrase.

Preferably, during decompression the depth and stencil buffer interact such that where wildcard phrases exist in a phrase, data of the phrase from a lower depth of the Zbuffer passes through.

Preferably, the compressed data contains codewords, the method further comprising:
obtaining the phrases by looking up the codewords in a dictionary.

Preferably, the codewords in the dictionary contain multiple phrases, and wherein the compressed data contains one or more checksums.

Preferably, the method further comprises:
decompressing the compressed data in parallel using each phrase;
calculating a checksum associated with the decompression;
comparing the calculated checksum to the checksum contained in the compressed data; and
determining which phase to use based on the comparison.

Preferably, the method further comprises: decompressing the compressed data by executing one or more functions.

Preferably, a function is referenced by a label and the function takes parameters, and wherein the compressed data contains the label and parameters.

In a fifth example embodiment, there is provided a computer program product comprising instructions which, when executed by a computer, cause the processor to perform a method of another embodiment.

In a sixth example embodiment, there is provided a non-transitory computer-readable medium comprising instructions which, when executed by a computer, cause the processor to perform the method of another embodiment.

BRIEF DESCRIPTION OF THE DRAWINGS

The accompanying drawings, which are incorporated in and constitute part of the specification, illustrate embodiments of the invention and, together with the general description of the invention given above, and the detailed description of embodiments given below, serve to explain the principles of the invention, in which:

FIG. 5 illustrates a first example of the use of a wildcard stencil in data compression;

FIG. 6 illustrates a second example of the use of a wildcard stencil in data compression;

FIG. 7 illustrates a third example of the use of a wildcard stencil in data compression;

DETAILED DESCRIPTION

Figure 1:
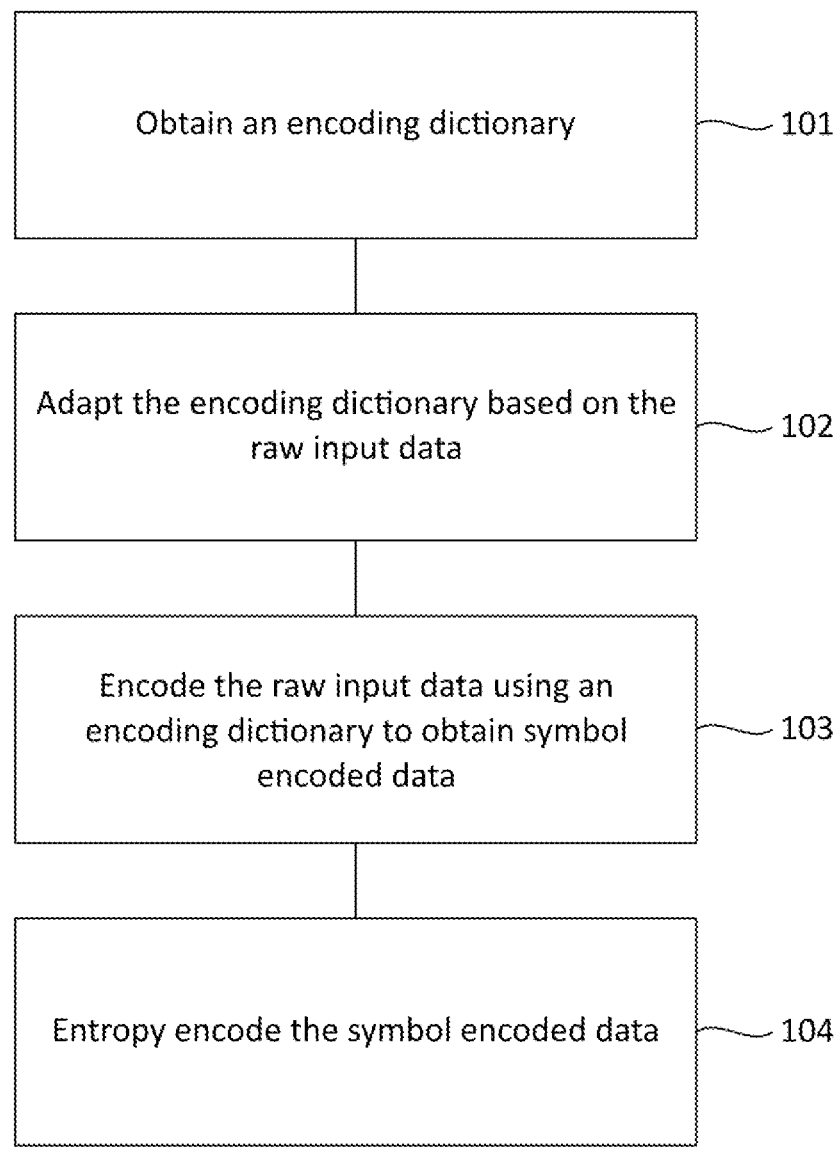
FIG. 1 is a flow chart of an example method for encoding raw input data using dictionary-based compression according to one embodiment.

FIG. 1 shows an example method for encoding raw input data using dictionary-based data compression. The raw input data comprises a stream of characters (such as binary digits).

At step 101, an encoding dictionary is obtained. This may be generated in advance, or may be generated on-the-fly when the raw input data is ready to be encoded. The encoding dictionary may comprise a number of entries, each entry being a map between one or more patterns and a symbol. Entries may include one or more of a map between a fixed pattern and a symbol, a map between a function and a symbol, a map between a wildcard pattern and a symbol, a map between multiple patterns or functions and a symbol, or a map between patterns and a hash of the pattern. In addition, the encoding dictionary may contain rules, such as overlap rules to provide how two or more patterns may overlap each other in use. Examples of approaches for generating an encoding dictionary are shown in FIGS. 3 to 9.

Figure 10:
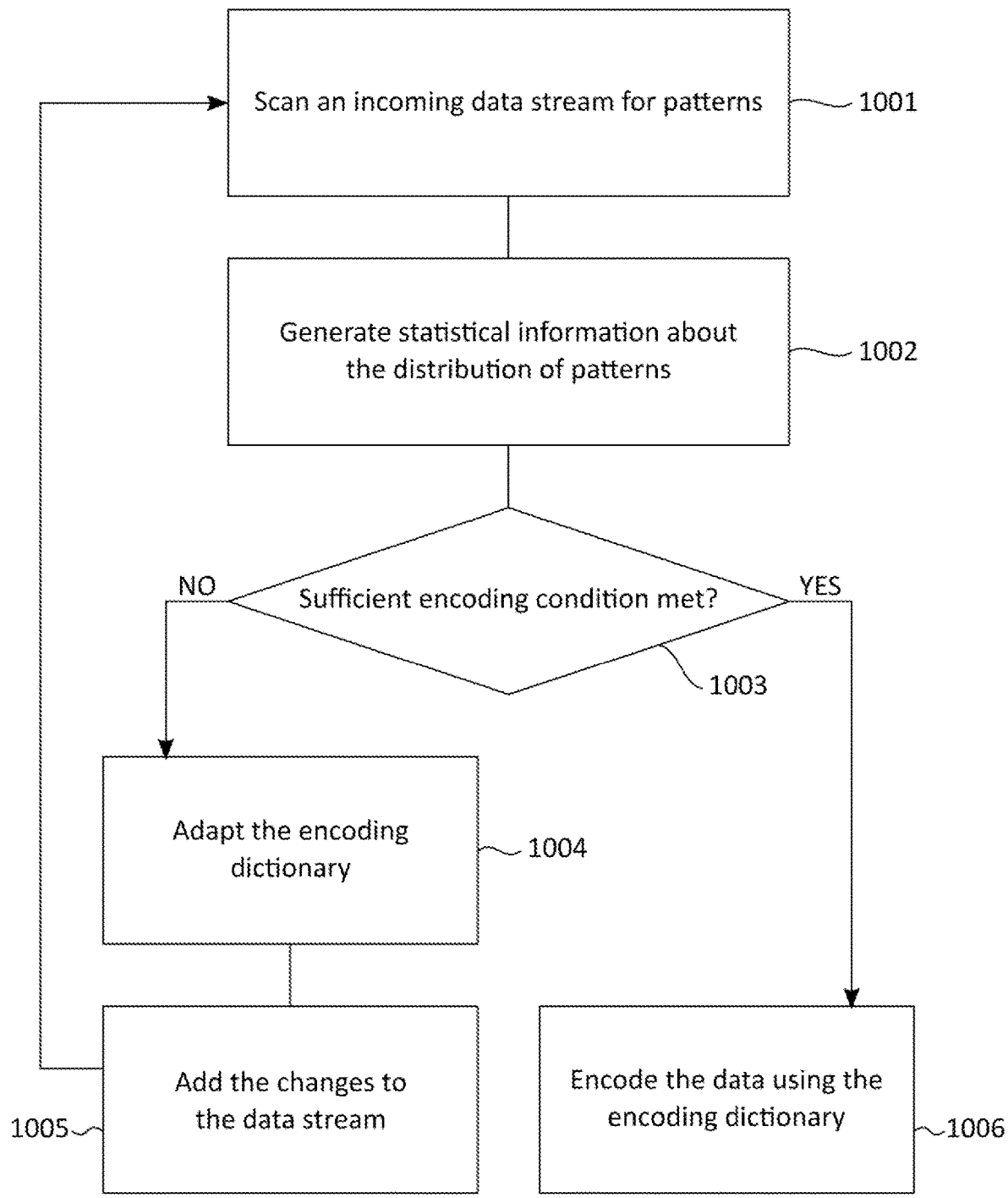
FIG. 10 illustrates an example approach for adapting an encoding dictionary.

At step 102, the encoding dictionary is adapted based on the raw input data. This may be to provide improved compression. Where the encoding dictionary is generated on-the-fly when the raw input data is ready to be encoded, steps 100 and 200 may be performed simultaneously. In other cases, step 200 may be omitted. An example of an approach for adapting an encoding dictionary is shown in FIG. 10.

At step 103, the raw input data is encoded using an encoding dictionary. This may involve identifying if a pattern of the encoding dictionary appears in the raw input data, and if so, replacing the pattern with the symbol for that pattern. More complex encoding rules may be provided by a dictionary. This results in symbol encoded data. In some cases, many possible reversible encoding permutations may be generated and the most compact one chosen.

At step 104, the symbol encoded data is entropy encoded. This may use arithmetic encoding or bit packing encoding. This can be used to further compress the symbol encoded data or to encode regions of the data stream that do not match entries in the encoding dictionary. This results in compressed, entropy encoded data. Step 400 may be omitted in some cases. Examples of approaches for encoding raw input data using an encoding dictionary are shown in FIGS. 11 to 14.

Obtaining an Encoding Dictionary

In some embodiments, an encoding dictionary is generated by first performing a search to identify a set of patterns that encode sample data.

A search may involve generating each possible pattern of characters up to the length of the data. However, once data is above a certain size, this becomes impractical due to the large number of patterns generated. In such cases, the number of bits in each generated pattern may be limited (such as only 1-, 2-, and 3-bit patterns in the case of binary data).

The data is then analyzed to determine the number of occurrences of each generated pattern in the data. Two patterns may overlap during the determination. For example, both 2-bit patterns "10" and "01" appear once in the binary data "101".

Tables 1 to 3 show the determination performed on the example binary data: 001101110001. Table 1 show the 1-bit patterns in the data 001101110001, Table 2 show the 2-bit patterns in the data 001101110001 and Table 3 shows the 3-bit patterns in the data 001101110001.

TABLE 1

| 1-bit Patterns | Pattern Count |
| --- | --- |
| 0 | 6 |
| 1 | 6 |

TABLE 2

| 2-bit Patterns | Pattern Count |
| --- | --- |
| 00 | 3 |
| 01 | 3 |
| 10 | 2 |
| 11 | 3 |

TABLE 3

| 3-bit Patterns | Pattern Count |
| --- | --- |
| 000 | 1 |
| 001 | 2 |
| 010 | 0 |
| 011 | 2 |
| 100 | 1 |
| 101 | 1 |
| 110 | 2 |
| 111 | 1 |

Parallel Permutation Search

The patterns are then consolidated into code phrases based on the determination. The aim of the consolidation is to find one or more subsets of the patterns that are optimal as a function of the combined size of the dictionary and the encoded data. An aim of this may be to optimise the versatility of the set of patterns. That is, the set of patterns should be provide useful encoding for the training data and non-training data.

In one approach, a parallel permutation search is performed to find the optimal subset of patterns that perfectly encodes the sample data. This involving checking, in parallel, each permutation of patterns to determine whether that permutation is optimal.

Not all subsets which perfectly encode the data are necessarily optimal in terms of compression. By way of example, using the data 01101110001, the dictionary shown in Table 4 would satisfy that requirement of perfect encoding. However, because each symbol is replaced with itself, this achieves no data compression.

TABLE 4

| Encoding Dictionary Index | Pattern |
| --- | --- |
| 0 | 0 |
| 1 | 1 |

The single-entry dictionary seen in Table 5 would achieve maximum possible data compression but no overall compression when the size of the dictionary is included in the resulting compression calculation.

TABLE 5

| Encoding Dictionary Index | Pattern |
| --- | --- |
| 0 | 001101110001 |

Traditional compression dictionaries can employ prefix codes such as Huffman encoding to label dictionary entries for compression. These prefix codes are useful for serial compression but obstruct efficient parallel compression.

To allow for parallel compression, dictionary entries are simply numbered from 0-N, where N is the last dictionary index entry chosen. If N requires 17 bits to encode it, then all dictionary entries are 17 bits initially. The compression inefficiency of fixed bit-width dictionary code words may be dealt with during a separate entropy encoding process.

For a small sample of data, a complete search of all possible pattern combinations can be performed to find the optimal dictionary to maximize compression on the sample data as a function of the combined size of the dictionary and the encoded data. Given the small data sample 001101110001, if the pattern search were confined to 1-3-bit patterns, several equivalent optimal encoding dictionaries may be found to exist.

For very large data samples, however, complete permutation searches for optimal dictionaries are computationally infeasible even for the fastest parallel computers. Thus the search for optimal pattern combinations may use a number of techniques to reduce the number of combinations considered.

Using a Zbuffer in Determining a Set of Patterns

In some embodiments, statistical heuristics are used to weight the likely compression value of certain patterns. This can be used to reduce the set of possible pattern combinations that need to be searched for effective codec dictionary solutions.

One example of a statistical heuristic is the Shannon index. This reflects whether a given pattern occurs relatively more frequently than other patterns. A pattern having a higher Shannon index may be assumed to have a higher likelihood of providing useful compression.

Weighted patterns are sorted into a ranked list of pattern priorities to search, with the highest priority patterns being those most likely to result in useful compression. Patterns are tested in combinations of those patterns in ranked order for possible optimal dictionaries.

One approach to this testing makes use of a Zbuffer.

A Zbuffer is a component of a graphics system, which can be used for handling occlusion of objects by storing the distance from a viewer for a set of rendered pixels. The Zbuffer comprises a number of cells forming a 2-dimensional array. The value in each cell in the Zbuffer is the shallowest object overlapping (all, or for example, at least half of) that cell. A Zbuffer may be implemented in hardware or software.

Figure 2:
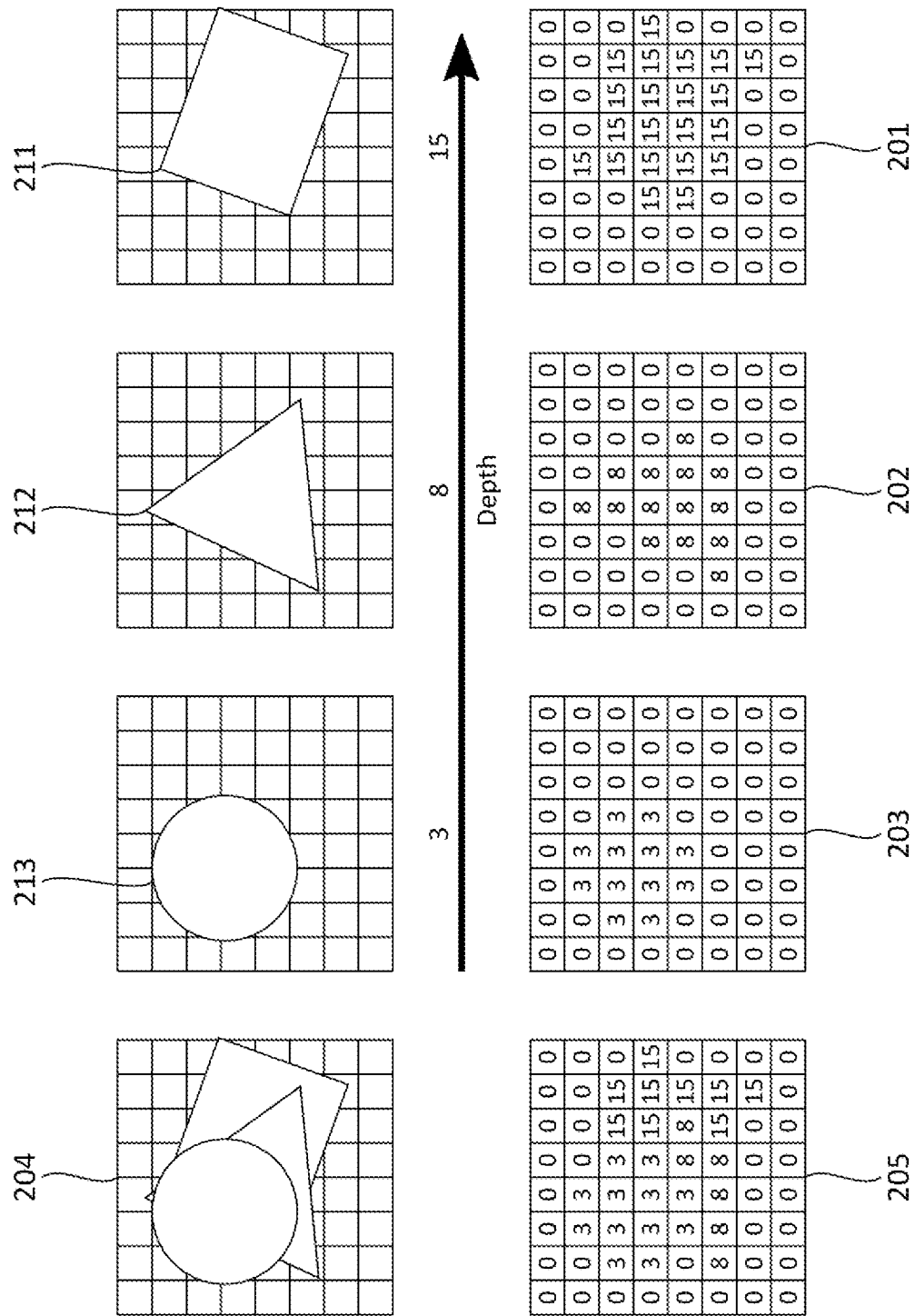
FIG. 2 illustrates the use of a Zbuffer in 3D graphics rendering.

FIG. 2 illustrates an example of the use of a Zbuffer in 3D graphics rendering.

Three objects 211, 212, and 213 are located at three respective depths. A view of the Zbuffer rendering each object in isolation is shown at 201, 202, and 203 respectively.

Object 211 is at depth 15. View 201, corresponding to depth 15, shows that cells overlapped by object 211 have the value 3, and the other cells have the value 0. Object 212 is at depth 8. View 211, corresponding to depth 8, shows that cells overlapped by object 212 have the value 8, and the other cells have the value 0. Object 213 is at depth 15. View 203, corresponding to depth 15, shows that the cells overlapped by object 213 have the value 15.

View 204 shows how the three objects 201, 202, and 203 are rendered. The combined rendered frame renders the lower-numbered (and thus shallower) buffers over the higher-numbered (and thus deeper) buffers. Because object 213 is at a lesser depth, it is rendered on top of the other objects, which are at a greater depth.

View 205 shows the values in cells corresponding to all three objects. Any cell which showed 15 in view 203 also shows 15 in view 205. This reflects that object 213 is the shallowest object, and therefore is rendered in front of the other objects.

This use of a Zbuffer allows a number of objects at different depths to be rendered appropriately and efficiently.

A Zbuffer can be used to identify an appropriate subset of patterns for use as codewords in dictionary-based compression. This is explained with reference to the example in FIGS. 3 and 4. Patterns are sorted in the order of their likely contribution to the compression, as calculated by the heuristic weighting function. For example, statistical methodologies such as chi-squared analysis may be applied to correctly weight the value of various participating patterns, based on their probable information content and probable recurrence in future related data.

Buffer 300 shows an example 64-bit piece of data to be encoded. A statistical heuristic has indicated that there are three patterns which are the most likely contributors to the compression of the data. In order of most-to-least contribution, these are patterns 303, 302, and 301.

Figure 3:
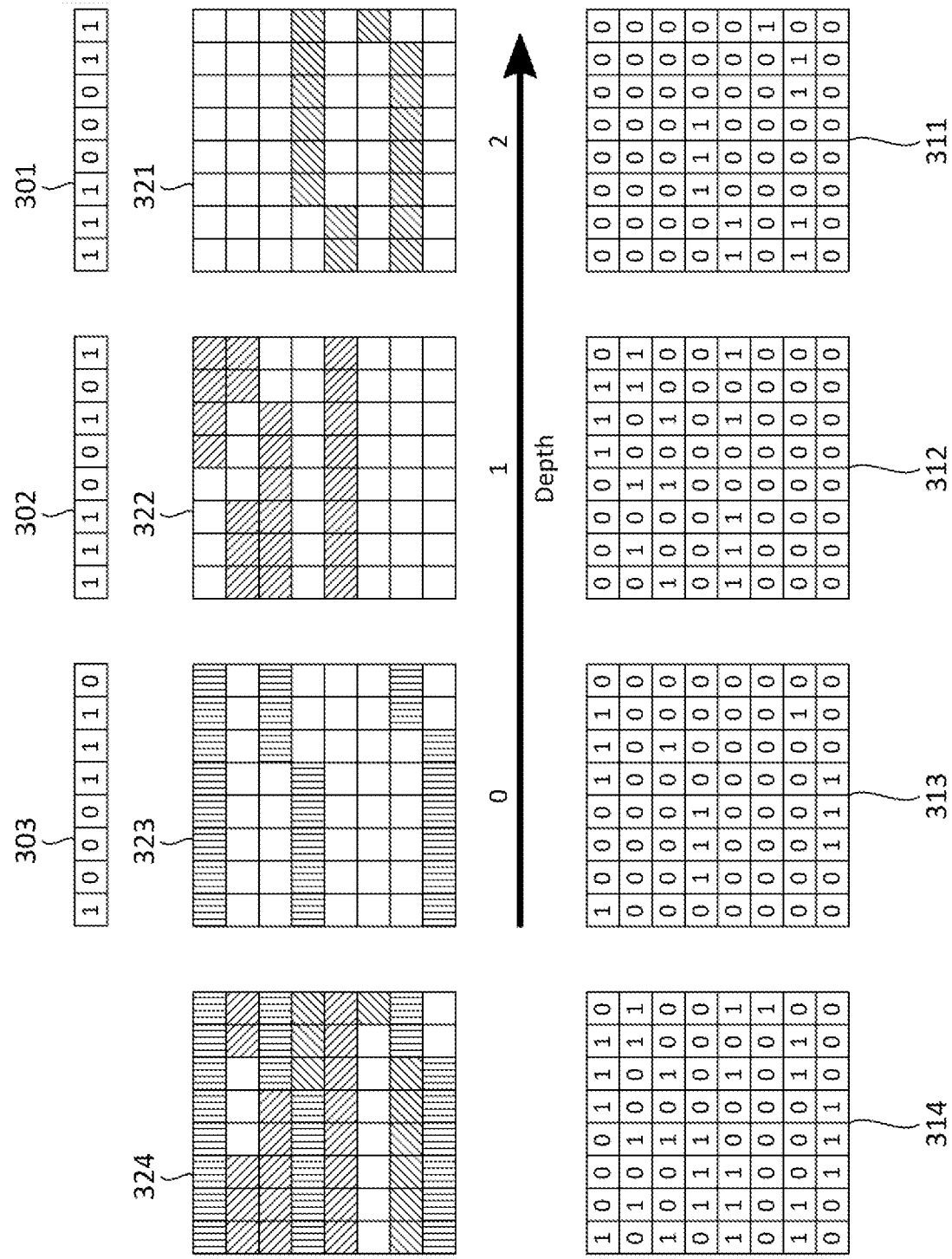
FIG. 3 illustrates a first example of the use of a Zbuffer for compression.

In FIG. 3, the patterns are ordered from shallowest to deepest as pattern 303 (with index 0), pattern 302 (with index 1), and pattern 301 (with index 2). These are considered in order of index. Thus, pattern 303 is applied first. This involves constructing a frame 313 of the same size as the data in which any instances of pattern 303 maintain their value, and all other cells are given the value 0. This frame becomes the contents of the Zbuffer (since the Zbuffer is otherwise empty). Frame 323 shows the positions of pattern 303 in the frame 313. Then, a permutation search among the other highest-ranked patterns is performed to determine which other pattern contributes the most to the encoding of the data (given pattern 303 has already been selected). Thus pattern 302 is applied second, as it results in a higher contribution to compression than pattern 301. A frame 312 is constructed in the same way as frame 313. Frame 312 has a greater depth than frame 313. Frame 322 shows the positions of pattern 302 in the frame 312. Thus when frame 313 and frame 312 are combined in the Zbuffer, the value of a given cell will show the corresponding value from frame 313. If this is not specified, the values from frame 312 is used.

This process is repeated by applying pattern 301 to generate a deeper frame 311. Frame 321 shows the positions of pattern 301 in the frame 311. Frame 311 is combined with frames 313 and 312 in the Zbuffer. Further patterns may be applied until the data is sufficiently encoded (such as in terms of the number of selected codewords or the level of compression), until no more patterns are available, until the compression contribution of a next codeword is below a threshold, or another condition is satisfied.

As a consequence of this, the ordered encoding {0, 1, 1, 0, 2, 1, 2, 0} for the data is obtained. This reflects the indexes of the patterns used. Buffer 314 shows the outcome of the encoding, and frame 324 shows the contribution of each of the patterns to this.

There is some overlap between the codewords as they appear in the data. The rules for how patterns overlap during decoding are noted below. In addition, there remains some unencoded data. The circumstances in which this is allowed is described below.

Figure 4:
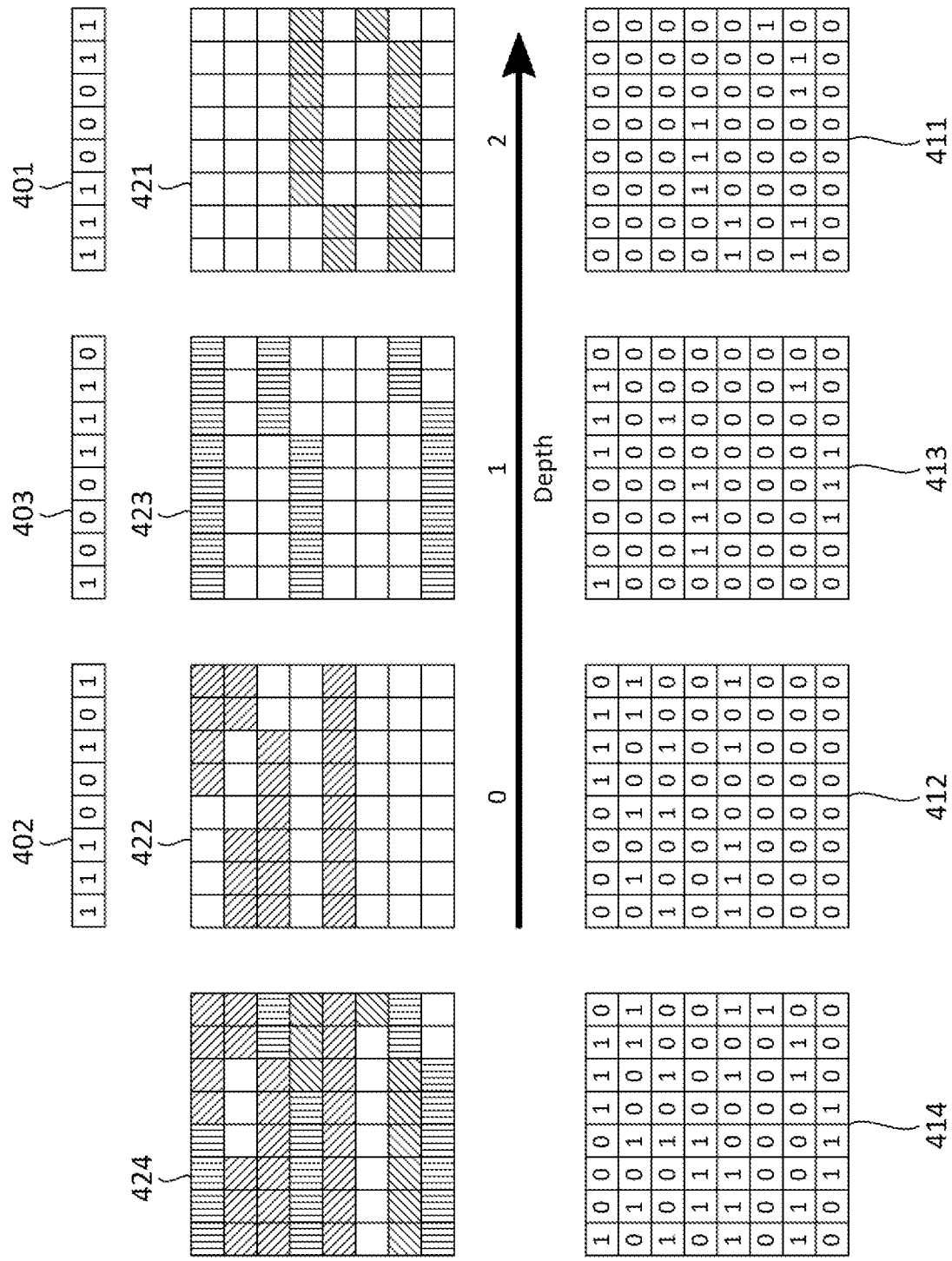
FIG. 4 illustrates a second example of the use of a Zbuffer for compression.

FIG. 4 shows an alternative encoding of the same data. In this case, a statistical heuristic has indicated that the patterns should be ordered, from most to least contribution, are patterns 402, 403, and 401. These correspond to patterns 302, 303, and 301 respectively.

The contribution of each of patterns 402, 403, and 401 are shown in frames 412, 413, and 411 respectively. In addition, the location of patterns 402, 403, and 401 are shown in corresponding frames 422, 423, and 421. Buffer 414 shows the outcome of the encoding, and frame 424 shows the contribution of each of the patterns to this. Notably, the value of buffer 414 is identical to the value of buffer 314. However, the location of the patterns with regard to the final outcome, as shown by frames 324 and 424, is different due to the different ordering of patterns.

By applying a similar approach, this results in a different encoding: {1, 0, 0, 1, 2, 0, 2, 1}. Both encodings have the same level of compression. In this way, there may be multiple equivalent encodings for the same data.

In some embodiments, it may not be desirable to optimize for optimal overall compression of the sample data combined with a dictionary. For large scale storage processing, the size of the dictionary may be irrelevant, in which case statistical weightings may be chosen to favor maximizing overall data compression or to balance overall compression with codec generality across a range of data sample types without regard to the overall size of the dictionary cache.

Overlapping Patterns

In some embodiments, no assumption is made that patterns are encoded and decoded in sequential order with the last bit in a pattern directly adjoining the first bit in the next encoded pattern. That is, an encoding dictionary may be generated on the basis that patterns of data may overlap and occlude one another at a bit granularity. Overlapping patterns can be determined during the process of searching for optimal encodings. Because patterns are permitted to overlap with one another, an efficient method is required to quickly test combinations of patterns and account for any encoding redundancy that may occur from choosing dictionary entries that may overlap one another. In one embodiment, a parallel Zbuffer, such as those used by GPUs for 3D graphics, is used to quickly compute the overlap or possible encoding redundancy of any two or more dictionary entries.

In some embodiments, the lowest value dictionary indices are assumed to encode the shallowest position in a Zbuffer with subsequent higher index value patterns encoding in higher layers in a Zbuffer. This means that the lower indexed patterns occlude the high indexed patterns where two patterns may overlap.

The Zbuffer may also be used for data encoding such that all patterns can be encoded into a Zbuffer in parallel without blocking or memory collision concerns. As long as all patterns are encoded at a Zbuffer depth corresponding to their dictionary index the final decoded data will come out correctly when the Zbuffer is rendered. Depth 0 is the highest depth in the Zbuffer with depth 1 to n having greater depth.

The dictionary may include rules that describe the conditions under which patterns are allowed to be encoded to overlap with one another. This allows the overlap between two or more patterns to be computed on-the-fly, and may avoid the need to store additional overlap offset information in the dictionary or the data stream. These rules may be predetermined during the creation of the dictionary, or may be programmatically or heuristically determined in order to maximize the compression of the dictionary. In some cases, the depth of a particular encoding pattern may be adaptively changed in the codec dictionary to change the order in which patterns are allowed to overlap to achieve better compression.

In some cases, overlap encoding conditions which may be present in a dictionary include:

Limiting overlap to within byte, word, dword or other arbitrary bit-width boundaries.

Overlap where overlapping bits perfectly match.

Overlap where bits within patterns perfectly match with wildcard patterns included.

According to any programmatically defined rule.

The use of such overlap rules may have specific applications. For example, in some cases, the overlap rules may be configured for:

Finding and encoding dimensionality in data, such as 2D images, or structured data records such as a TCP/IP packet header 100.

Encoding file headers in which large portions of a header contains redundant information for a given data or object type with a few variable regions of the data.

Encoding large pattern runs that may be interrupted with small periodic variable data regions.

Functions as Entries in the Encoding Dictionary

For any pattern in a dictionary, it is possible to consider it as the output result of a function and given input parameters. For example, all data runs of some value may be described by a function that takes the base pattern and the number of runs as parameters and outputs a binary pattern of that pattern count.

Thus, in some embodiments, one or more dictionary entries comprise functions (with or without parameters) that generate the binary patterns, instead of directly recording the binary patterns in the dictionary.

For performance purposes, these function-generated patterns may be pre-computed and cached at run-time.

In determining whether a function should be used to store a pattern, a pool of pre-computed functions may be considered in turn to determine if a function provides a better solution. In this case, better may mean smaller in size in the encoding dictionary. One such function may be a simple "repeat" function. That is, given an input pattern and number of repeats, the output pattern is that patterns repeated that number of times. If it is possible to describe a pattern using such a function in a way that is smaller in size than storing the pattern itself, the function (with any necessary parameters) may be used in the dictionary.

In some cases, a function may generally match data, though not perfectly. In such cases, the function may be stored with corrections if this results in a better solution than not using a function at all.

Using Hash Codes for Patterns

In some embodiments, hash codes may be used to represent composite patterns. These composite patterns may be produced by taking multiple related patterns such as repetitions, shifted, scaled and subset/superset versions of a base pattern, hashing each variation and the combining all of the hash codes together into a single hash value and base pattern. This composite hash code can be used to determine whether or not a given pattern is a member of a transform set of a pattern already represented in an encoding dictionary.

In some embodiments the encoding dictionary may be structured as a hash table or other sparse data structure instead of as an integer indexable array. This enables multiple patterns to correspond to the same dictionary entry. For encoding purposes, the hash values corresponding to matching dictionary entries would be substituted for sequential index values assigned to hash table entries in order. Use of hash values for encoding may be appropriate where encoding dictionaries contain large sparsely occurring patterns.

In use, the encoding dictionary scans a sequence of raw input data in the training set to find the occurrences of a pattern. It needs to determine if this pattern is a transformed (such as shifted or truncated) variant of an existing pattern in the dictionary. It therefore computes a hash code for all shift variants of the pattern and XORs them all together. This is compared to the same hash code for the same set of shift transformations on an existing pattern. If the resulting hash codes match, then the new pattern can be stored as a transformed variant of an existing pattern. For example, a new pattern may be 1001011. It is found that the hash code for this matches pattern 17 already in the dictionary. This is because pattern 17 in the dictionary, 0111001, is a shifted version of the same pattern. In this way, it is possible for the new pattern 1001011 to be stored as a shifted variant of pattern 17. This can reduce the size of the encoding dictionary because although there are six possible shift variants of pattern 17 only two of them actually occur in the training data.

In a further example, given the input pattern 1001, it may be useful to determine if this pattern is a subset of any pattern in the dictionary. While performing a bitwise mask against every pattern in the dictionary and all of their shift variants would be possible, this approach may not lend itself well to highly parallel computing. Instead, the value 1001 may be padded with all possible combinations of 3-bit patterns that might match any 7-bit pattern as illustrated in Table 6.

TABLE 6

| Padded 7-bit patterns |
|---|
| 1001000 |
| 1001001 |
| 1001010 |
| 1001011 |
| 1001100 |
| 1001101 |
| 1001110 |
| 1001111 |

These values are ordered in a replicable order (such as from lowest to highest) and concatenated. A hash is then computed from the concatenated values. It is then possible to determine if one of the patterns matches another pattern in the codec dictionary. In this example, 1011101 matches pattern 17 (0111001), since 1011101 is a shift variant of pattern 17. Thus the hash of the ordered concatenated shift variants for both patterns will be the same. Thus the original pattern 1001 is a subset of an existing pattern, and can therefore be stored at a variant of pattern 17.

These kinds of composite permutation hash codes can be useful for parallel compression because they can be used to trade better compression for larger compute demands.

In a further example, during training of a code, the patterns illustrated in Table 7 are found to occur in the training data.

TABLE 7

| Pattern | Count |
|---|---|
| 101 | 23 times |
| 011 | 6 times |
| 110 | 1 time |

All three patterns can be stored in the compression dictionary as a single composite hash code. Since the dictionary knows that 101 is the most likely 3-bit version of this pattern to occur during compression, it can first attempt to decode the data using the most likely version of the pattern and then check the decoded data against a hash code checksum for that data sample to see if it matches. If it does not match it can decode the data using the next most common pattern variation until it eventually finds a permutation that matches the encoded data checksum hash. Searching for permutations of patterns that match a hash code can enable higher compression efficiencies by storing related patterns as composite hash functions instead of as raw data.

Hash Code Accelerated Permutation Searches

In general, compression works by converting computing power into storage savings. Instead of storing raw data a program is run to compute the original raw data from compressed encoded data. Most known lossless compression solutions require that data is encoded in a perfectly reversible format to ensure that the data can reliably be decoded.

In some embodiments, data is encoded using ambiguous encoding rules. That is, rather than a one-to-one correspondence between a symbol and a pattern, the encoding may use a one-to-many correspondence between a symbol and multiple patterns.

A hash code checksum may be stored with the encoded data to help a decoding algorithm choose an interpretation of an ambiguous set of decoding rules for decoding a compressed stream that reproduces the correct original result.

Therefore, when encoding data using an ambiguous encoding dictionary, a hash code checksum may be computed initially. Multiple permutations of the encoding may be attempted to determine an encoding providing greatest compression. This is verified using the original hash code to ensure that the encode is decodable to obtain the original data.

When decoding encoded data using an ambiguous encoding dictionary, several permutations may be performed to determine which matches a checksum for the encoded data. When the correct checksum is obtained, this indicates that the correct interpretation of the ambiguous encoding dictionary was used.

In some embodiments, intermediate hash code checksums may be stored with a compressed data stream in order to narrow a combinatorial permutation search for compression or decompression solutions satisfying ambiguous reversibility rules. This may prevent a combinatorial search from becoming impractically large.

In some implementations, unrelated data patterns are stored in a common entry. In this example the pattern 01110 may have a 95% probability of occurring while the pattern 10101010 may have a 0.0001% probability of occurring in the input data stream. Both patterns in the dictionary may be represented by the same function. This would mean that during compression, occurrences of both the pattern 01110 and the unrelated pattern 10101010 would be encoded with the same dictionary codeword. To decode the resulting symbol correctly the decoder would first try substituting the most commonly occurring pattern associated with the symbol and checking the hash code verification for that sample of the encoded data for correctness. If the hash test failed, the decoder would substitute the less common occurrence pattern 10101010 and check the verification hash for the data again until some combination of ambiguous symbols produced a decoding that matched the verification hash code for the original input data.

In some cases, the probability of a given pattern is different at different parts of the data stream. This may be recorded as part of the function. Thus where two patterns are represented by the same function, the order in which the patterns are attempted during decoding may vary depending on where the pattern occurs.

Wildcard Patterns as Entries in the Encoding Dictionary

A wildcard pattern is a pattern that includes bits which may be either 0 or 1. For example the wildcard pattern 011**11 would match 0111111, 0110011, 0111011, and 0110111. Wildcard patterns are useful for a variety of compression purposes. For example, a sample of input data composed of 32-bit RGBA image data, each piece of data being composed of 1-byte red (R), green (G), blue (B), and alpha (A) channels. The value of the red, green, and blue bytes may not be closely correlated with one another, but each byte may be closely correlated with their neighboring bytes of the same color channel. Conventional compression tools for image compression are generally designed to know that they will always be given image data to compress. However, in a general datacenter storage and computing environments, blocks of arbitrary data may be stored and processed without the context to know that the data is an image type. In some embodiments, complex data structures in data samples are identified during training. This allows for automatically generating encoding dictionaries that take advantage of this information to improve compression. Thus the system searches for structure or dimensionality in data and provides a generalized way of representing it in an encoding dictionary.

Wildcard patterns provide a way to automatically search for dimensional relationships in arbitrary data and represent them in a compression dictionary. A search to identify a set of patterns that encode sample data may include scanning for wildcard permutations. For example, in the case of RGBA data, the codec training engine may find that the 32-bit wildcard pattern ****** **** ****** 00000000 has a high hit correlation on a sample of input data because it includes 32-bit RGB data with an empty alpha channel byte.

Examples of this are shown in FIGS. 5, 6, and 7.

FIG. 5 shows sample input data 501, 502, 503, 504, and 505, each of which has an empty alpha channel byte. This is denoted by the alpha channel byte in each piece of data having all zeroes. The bits in regions 511, 512, and 513 are identified as being common to all the data in the sample. The data outside of regions 511, 512, and 513 may differ, or may be encoded by another dictionary entry. Based on regions 511, 512, and 513, a pattern 521 is generated. Pattern 521 contains wildcards for the bits outside of regions 511, 512, and 513, and thus only encodes bits relating to the red and alpha channels.

FIG. 6 shows the same input data as FIG. 5. However, the bits in regions 611 and 612 are identified as being common to all the data in the sample. This may differ from regions 511, 512, and 513 due to different existing entries in the dictionary. Based on regions 611 and 612, a pattern 621 is generated. Pattern 621 contains wildcards for the bits outside of regions 611 and 612, and thus only encodes bits relating to the green and alpha channels.

FIG. 7 shows the same input data as FIG. 5. However, the bits in regions 711 and 712 are identified as being common to all the data in the sample. This may differ from regions 511, 512, and 513, and regions 611 and 612, due to different existing entries in the dictionary. Based on regions 711 and 712, a pattern 721 is generated. Pattern 721 contains wildcards for the bits outside of regions 711 and 712, and thus only encodes bits relating to the blue and alpha channels. In addition, wildcard patterns may be used to capture values which fall within a specific range. For example, the red channel of a sample may generally be between 64 and 128. In this case, the wildcard pattern: 0001** **** ****** 00000000 would match most of the red samples in the image. With overlapping patterns allowed, a set of overlapping patterns for each channel may be computed that when combined in layers provide a general compression solution. The constant bits in the wildcard function as keys that can guide the codec to automatically detect that a given sample of data is actually 32-bit aligned image data because the permutation search for optimally compressing data will find a high correlation with this pattern and optimal compression results for image data with this structure.

Figure 8:
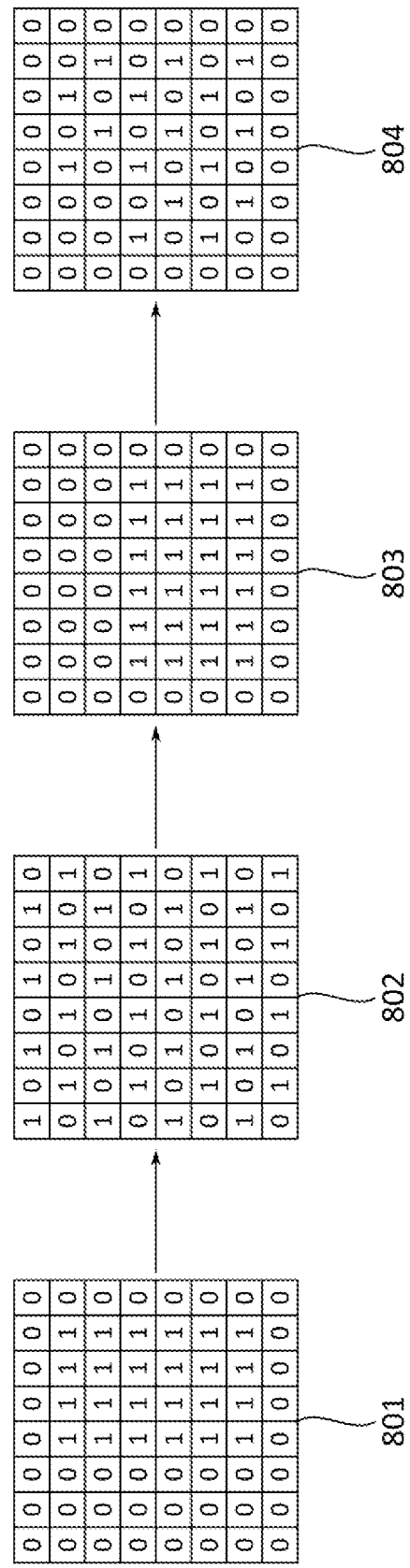
FIG. 8 illustrates the use of a stencil buffer works in concert with a Zbuffer.

In some embodiments, a Zbuffer may be used together with a stencil buffer to identify, encode, and decode wildcard patterns. The stencil buffer can be used to ensure that wildcard regions of patterns are excluded from rendering to the Zbuffer to prevent wildcard bits from occluding patterns that occur at other levels in the Zbuffer during encoding, decoding and pattern searching. An example of this is shown in FIG. 8. A frame buffer 801 has a stencil buffer 802 applied. This prevents wildcard bits from occluding patterns that occur at other levels, such as in frame buffer 803. Thus the use of the stencil buffer to enable a wildcard pattern results in the decoded output 804.

Figure 9:
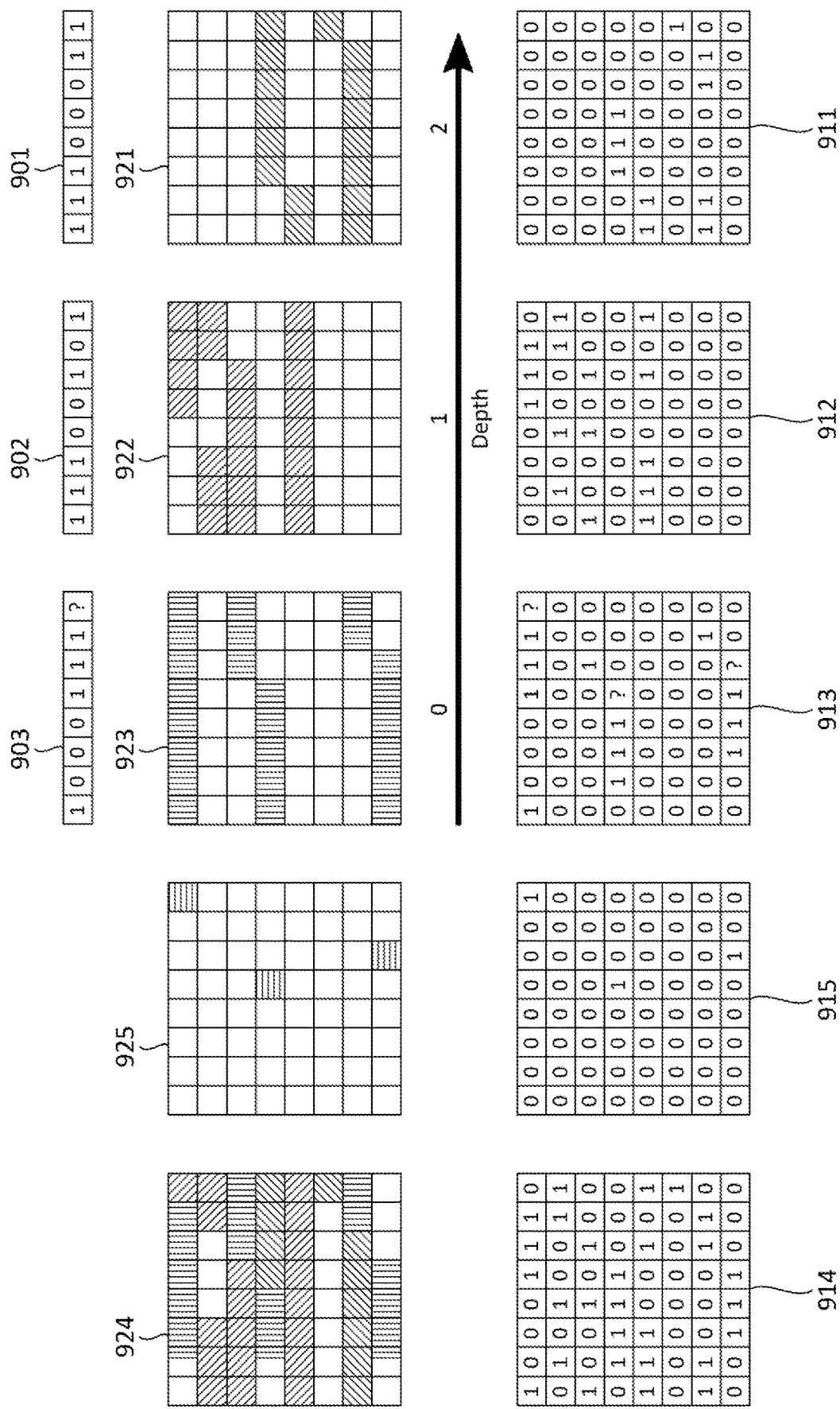
FIG. 9 illustrates the use of a stencil buffer works in concert with a Zbuffer for encoding.

FIG. 9 shows a further example of how a stencil buffer may be used in combination with a Zbuffer to render wildcard patterns. FIG. 9 is generally similar to FIG. 3. Patterns 901, 902, and 903 have been determined as being likely contributors. Patterns 901, 902, and 903 are the same as patterns 301, 302, and 303, except pattern 903 contains a wildcard in its final bit. Frames 911, 912, and 913 show the effect of applying patterns 901, 902, and 903 respectively, and frames 921, 922, and 923 show the locations of the patterns 901, 902, and 903 respectively.

A stencil buffer 915 is generated which has a 1 in any bit corresponding to the wildcard in pattern 903. Frame 925 shows the location of the effect of the bits of stencil buffer 915. When encoding, the stencil buffer 915 is applied to ensure that the wildcard bit in pattern 903 does not occlude the data from any lower pattern (namely, patterns 901 and 902). This results in buffer 914. Buffer 914 therefore differs from buffer 314 due to the use of a stencil buffer 904 at the locations where the stencil buffer 904 has a 1. The stencil buffer may be implemented in hardware or software.

Encoding Unrepresented Patterns

In some embodiments, encoding dictionaries may be provided with "failure" patterns to be applied to data patterns that don't match a dictionary entry or a set of overlapping patterns efficiently. For example, given the dictionary illustrated in Table 8, failure patterns may be encoded at indices 100 (corresponding to decimal 4) and 101 (corresponding to decimal 5) as seen in Table 9.

TABLE 8

| Codec Dictionary Index | Symbol |
| --- | --- |
| 000 | 011 |
| 001 | 111 |
| 010 | 01010 |
| 011 | 00001 |

TABLE 9

| Codec Dictionary Index | Symbol |
| --- | --- |
| 100 | 0 |
| 011 | 1 |

The addition of failure patterns increases the number of bits needed to encode each index by 1 bit in this example. A parallel pattern scan and Zbuffer encoding using the base 2-bit dictionary can be performed first to detect if any or all of the failure patterns are required to fully encode the input data. If they are required then the failure patterns are added to the dictionary, the bit count of each encoding is increased to 3 and the data is re-encoded including the failure patterns to encode any patterns not found in the dictionary.

Although using the single bits 0 and 1 assigned to 3-bit code words will inefficiently encode failed patterns, this outcome can be improved on by assigning new higher dictionary entries to larger specific unencodable patterns found during Zbuffer scanning. For example, if the pattern 10110110110101 is found not to be encodable by the dictionary, it may simply be assigned to a high order index in the dictionary and encoded using that index. Adaptive changes to the dictionary necessary to decode the data including changes to the dictionary's sort order and added patterns can be stored with the compressed data as adaptive differences to the base dictionary. These differences can be applied to the base dictionary before subsequent decompression.

Testing an Encoding Dictionary

Once a compression dictionary is trained from a set of sample data, the compression dictionary may be tested against a set of similar data to measure its compression efficiency. Thus, each piece of data in the sample data set is encoded using the trained dictionary, and the level of compression is calculated.

It may be found in the course of testing that certain compression patterns not found in the training sample data or found but not chosen for the compression dictionary exhibit better overall compression than the chosen compression patterns in the dictionary. In one embodiment, the finalized dictionary may keep some of these patterns in a pattern sideboard that may be adaptively substituted when the compression dictionary is in use to make the codec more versatile. The pattern sideboard is a list of encoding patterns found during previous training sessions and their related metadata that are not assigned an index in the encoding dictionary. These are patterns that were found during training to be relevant but that did not happen to optimal choices for the training data set.

The dictionary may also contain some statistical heuristics generated during training that help the trained codec identify data streams that the codec is a good candidate to compress and to quickly exclude data it will not compress well.

Using Hashes of Patterns

In some embodiments, pattern entries in the dictionary are replaced with hash codes of the pattern's value. These hash codes, particularly for large patterns, may be used instead of actual data patterns to reduce memory consumption and accelerate data processing. During decompression, the original large data patterns may be recovered by using the hash codes in the encoded data stream to recover the large original pattern from a database or object store.

Adaptive Encoding

A fixed encoding dictionary may not achieve the best possible compression of a stream of incoming data. Therefore, in some embodiments, the encoding dictionary may be adapted on the fly to achieve better compression results.

FIG. 10 shows an example approach for adapting an encoding dictionary.

At step 1001, an incoming data stream is scanned for patterns in the encoding dictionary.

At step 1002, statistical information about the distribution of patterns in the input data is generated. This may be omitted in some cases.

At step 1003, it is determined whether a sufficient encoding condition is met. This may relate to whether the input data pattern distribution falls within a target compression value range, or whether a certain level of compression has been reached. If the sufficient encoding condition is met, the method proceeds to step 1006. If the sufficient encoding condition is not met, the method proceeds to step 1004.

At step 1004, when the sufficient encoding condition is not met, the encoding dictionary is adapted to better meet the sufficient encoding condition. Adaptations may include changing the order of some patterns, adding or removing patterns, adding new failure patterns to the dictionary, or changing the encoding rules (such as overlap rules).

At step 1005, these changes are added to the compressed data stream as delta changes to the dictionaries previous state in order to reproduce the adapted encoding dictionary.

A variety of commonly used efficient difference encoding and or compression methods may be used to efficiently represent the changes to the dictionary that will be added to the data stream to reconstruct the correct dictionary during decompression. Examples of this include:

Entries may be sorted into a new more efficient order with their new positions recorded as additive or subtractive changes to their previous index positions.

Entries may be added, removed or changed with these changes represented as differences to the default codec dictionary. An added or removed entry may be indicated by an inserted or deleted dictionary entry and new entry may be recorded as a change to an existing entry.

Statistical information about the codec may be updated to include the weighted influence of the new sample data.

After step 1005, step 1002 is re-performed on the basis of the adapted encoding dictionary.

At step 1006, when the sufficient encoding condition is met, the method proceeds to encoding the data using the adapted encoding dictionary.

Encoding

Once an encoding dictionary is obtained, and the encoding dictionary is adapted (or the adaptation is omitted), raw input data can then be encoded.

An example encoded dictionary is shown in Table 10. Example raw input data is shown in Table 11.

TABLE 10

| Encoding dictionary index | Encoding | Pattern |
|---|---|---|
| 0 | 00 | 011 |
| 1 | 01 | 111 |
| 2 | 10 | 01010 |
| 3 | 11 | 00001 |

TABLE 11

| Raw input data |
|---|
| 00001110110101010101010111 |

First, the presence in the raw input data of each pattern in the dictionary is identified. Table 12 shows the presence of a number of the patterns.

TABLE 12

| Encoding dictionary index | Pattern count | Pattern | Compression pattern matches |
|---|---|---|---|
| 0 | 3 | 011 | 00001110110101010101010111 |
| 1 | 2 | 111 | 00001110110101010101010111 |
| 2 | 5 | 01010 | 00001110110101010101010111 |
| 3 | 1 | 00001 | 00001110110101010101010111 |

Although the entire raw input data is covered by available patterns in the dictionary, it is necessary to allow the patterns to overlap for the dictionary patterns to completely represent the data. That is, because encoding may be performed in parallel, information about how patterns align with one another is not available to each parallel encoding thread during processing. In some embodiments encoding can occur serially with the first matched pattern encoding first followed by subsequent matching patterns as seen in Table 13.

TABLE 13

| Encoding order | Sample data | Encoding |
|---|---|---|
| 1 | 00001110110101010101010111 | 11 |
| 2 | 00001110110101010101010111 | 01 |
| 3 | 00001110110101010101010111 | 00 |
| 4 | 00001110110101010101010111 | 10 |
| 5 | 00001110110101010101010111 | 10 |
| 6 | 00001110110101010101010111 | 10 |
| 7 | 00001110110101010101010111 | 01 |

This results in the encoding 11010010101001.

Overlapping Patterns

To avoid including pattern offset information about the overlapping patterns, the encoding dictionary may involve overlap rules. In the example above the overlap rule would be described as: All patterns are assumed to overlap where their right-most bits match the left-most bits of the subsequent pattern. If a subsequent pattern is completely occluded by a preceding pattern it will not be encoded. If the rightmost bits of a preceding pattern have no match with the leftmost bits of the following pattern, then they are assumed to be perfectly aligned with no overlap.

In this example a different overlap encoding rule might result in better compression but reduced parallel encoding performance. If the encoding rules simply forbid patterns from overlapping and required that matching phrases be perfectly aligned, then the encoding would be as in Table 14.

TABLE 14

| Encoding order | Input data | Encoding |
|---|---|---|
| 1 | 00001110110101010101010111 | 11 |
| 2 | 00001110110101010101010111 | Dictionary miss encoding |
| 3 | 00001110110101010101010111 | 10 |
| 4 | 00001110111010010101010111 | Dictionary miss encoding |
| 5 | 00001110110101010101010111 | 10 |
| 6 | 00001110110101010101010111 | Dictionary miss encoding |
| 7 | 00001110110101010101010111 | 01 |

This results in the encoding 11*10*10*01. Notably, there are three parts of the raw input data which could not be encoded. The resulting non-overlapping encoding would require inserting separate encoding symbols to represent the data that does not correspond to known dictionary entries. In this example, the resulting encoding would probably be larger than the encoding that allowed for overlapping patterns.

In some embodiments, ambiguous overlapping pattern rules may be possible. Thus, the encoded data stream is stored with a cryptographic quality hash code (such as SHA-2) checksum that is only reproducible when the data is decoded correctly. Encoding may then involve computing all possible interpretations of the ambiguous overlap rule and determining which provides the best compression.

Using a Zbuffer for Encoding

A Zbuffer may be used for parallel encoding. In the previous example, parallel encoding can be performed using a Zbuffer by rendering the matching pattern data to a Zbuffer at a depth corresponding to the pattern's encoding dictionary index value. Thus the first entry in the dictionary (0) would encode at the front of the Zbuffer (that is, its values would never be occluded by other higher index value patterns), while the last entry in the dictionary would encode at the back of the Zbuffer. Once the data stream is encoded in the Zbuffer, the Zbuffer can be scanned for the exposed depth values. The sequence of patterns exposed in the Zbuffer correspond to the encoding of a compressed datastream. Any redundant patterns that are completely overlapped during Zbuffer rendering are eliminated from encoding by the Zbuffer.

An example of the use of a Zbuffer in this way is shown in Table 15. An asterisk in the front of the Zbuffer indicates that the value is provided by the pattern of a lower dictionary index.

TABLE 15

| Index | Count | Pattern matches | Front of Zbuffer |
|---|---|---|---|
| 0 | 3 | 00001110110101010101010111 | ***011*011************011* |
| 1 | 2 | 00001110110101010101010111 | ****1****************1 |
| 2 | 5 | 00001110110101010101010111 | *******01010101010101** |
| 3 | 1 | 00001110110101010101010111 | 000*********************** |

This results in the encoding 11, 00, 01, 00, 10, 10, 10, 00, 01 using a least overlapping bits encoding rule. Unlike the serial encoding method shown in Table 13, the Zbuffer encoding method in Table 15 yields a different but equally valid encoding for the data from the same dictionary. The serial encoding approach shown in Table 13 achieved better compression than the parallel Zbuffer encoding approach shown in Table 15, however re-ordering the encoding dictionary improves its compression efficiency. An example of this is shown in Table 16.

TABLE 16

| New Index | Count | Pattern Matches | Front of Zbuffer |
|---|---|---|---|
| 3 → 0 | 1 | 00001110110101010101010111 | 00001******************* |
| 2 → 1 | 5 | 00001110110101010101010111 | ********0101010101010* |
| 1 → 2 | 2 | 00001110110101010101010111 | ***11**************111 |
| 0 → 3 | 3 | 00001110110101010101010111 | *****011************** |

This results in the encoding 00, 10, 11, 01, 01, 01, 10.

Thus in some embodiments, compression may be improved adaptively on-the-fly by trying different permutations of pattern orders in a Zbuffer, and selecting the order which results in the best compression. The differences necessary to encode the changes in the dictionaries encoding order may then be included with the compressed data stream to adaptively modify the dictionary to the correct state as encoding/decoding proceeds.

Entropy Encoding

Entropy encoding may be performed as the final stage in compression. Conventional approaches to arithmetic encoding may be applied to the final data to maximize compression. However, arithmetic encoding is typically a serial process, which may limit the ability to parallelize the encoding.

In some embodiments, bit-packing entropy encoding may be used. Bit-packing entropy encoding may result in improved parallel compression and decompression computability.

Bit-Packing Entropy Encoding

Bit-packing entropy encoding includes packing groups of encoded data samples into small fixed-width packets. For example, each packet may be 32 bits wide. Although packets can in practice be arbitrarily large, there are several benefits to limiting them to bit widths that match the register or cache widths of parallel processors that may be encoding and decoding them. For example, data can be loaded into a parallel processor, decompressed, and computed, and the resulting output data can itself be compressed into packets inside the same thread. The data is therefore moving through the computer's I/O system and memory in its optimally compressed form and only decompressed as it is needed for processing.

It may be inefficient to encode all of the bits in a dictionary index. A dictionary containing N packet entries may have been optimized such that the most valuable compression patterns in the dictionary will have the lowest encoding index in the dictionary. If N=257 (which is 100000001 in binary), then every entry in the dictionary will be encoded with a 9-bit value including the index value 0. However, the entry in the dictionary at position 0 will generally be one of the most common patterns occurring in the data stream. Related patterns in a stream may also tend to occur together.

Figure 11:
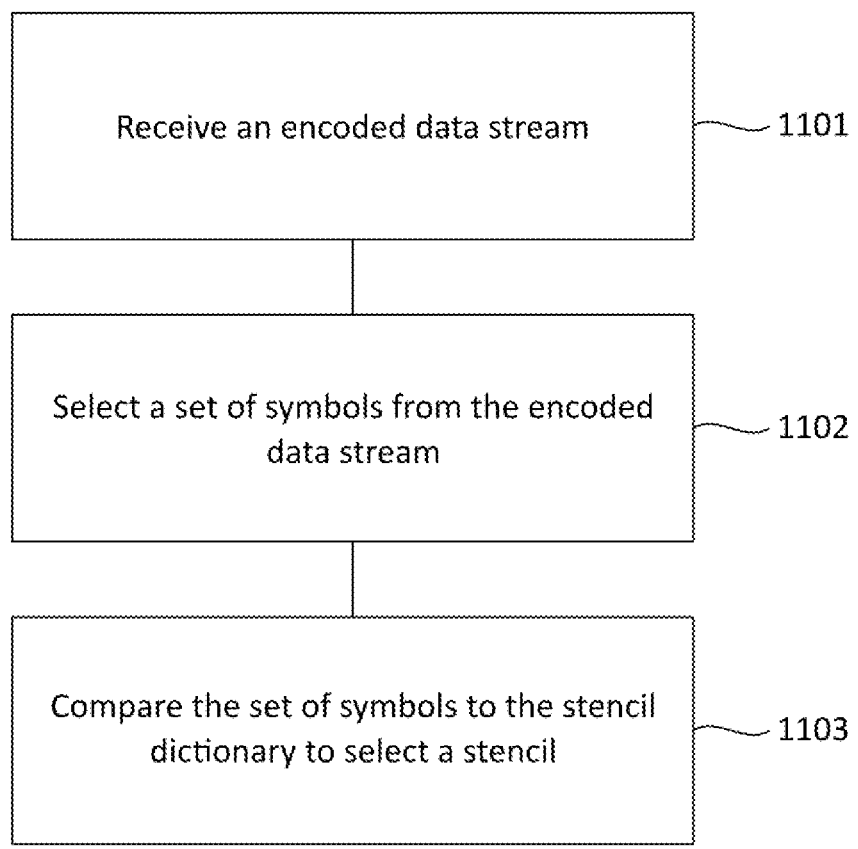
FIG. 11 illustrates an example approach to entropy encoding via bit-packing.

An approach to bit-packing is shown in FIG. 11.

At step 1101, an encoded data stream is received. For example, the encoded data stream is {47, 18, 27, 13, 7, 59, 1, 1, 3}. Each symbol may be stored as 8 bits, with several symbols being left-padded with zeroes in order to take up 8 bits.

At step 1102, a set of symbols from the encoded data stream is selected. For example, the selected symbols are {27, 13, 7, 59}. This selection may involve scanning the encoded data stream for runs of symbol sequences with the order and bit width of each symbol counted.

At step 1103, the set of symbols is compared to the existing stencils in a stencil dictionary to select the best representative stencil for the symbols. The stencil dictionary typically has a limited number of stencils. These may reflect bit masks that are likely to occur. One stencil in the stencil dictionary is a worst-case encoding stencil, which has no compression or may even expand data slightly. Each stencil includes a list of fields into which each of the selected symbols must fit (if zero-padding is omitted). The total number of bits in the fields of the stencil equals the packet size less the packet header size. The packet header indicates the stencil used, so the packet header size may be linked to the number of stencils available.

For example, if there are 32 stencils available, this requires 5 bits to provide a range of 32 values. Thus, 5 bits of the 32-bit packet may be reserved to indicate which of the 32 stencils are used, and 27 bits of the 32-bit packet may be used for data.

Thus the set of symbols noted above requires a stencil of at least {5, 4, 2, 6}. The search may involve applying transformations to the stencil (such as masking bits of each symbol, or rotating the stencil).

There may be several matches in the stencil dictionary. For example, the set of symbols may match stencil 0: {7, 7, 7, 6}, stencil 1: {6, 6, 6, 6, 3}; stencil 4: {4, 4, 3, 5, 4, 3, 4} (with a rule to mask the last set bit from every entry); stencil 19: {5, 5, 7, 5, 5}; and the worst-case stencil 31 {8, 8, 8, 3}. Stencil 0 matches since 5, 4, 2, and 6 are each less than or equal to 7, 7, 7, and 6 respectively. Stencil 1 is a match, in that 5, 4, 2, and 6 are each less than or equal to 6, 6, 6, and 6. However, stencil 1 includes a final 3-bit field which would remain unused. Stencil 4 is a match, in that 5, 4, 2, and 6 (with the last bit masked) are less than or equal to 4, 4, 3, and 5 respectively. However, stencil 4 includes three fields which would remain unused. Stencil 19 is a match if it is rotated rightwards to arrive at a {5, 5, 5, 7, 5} stencil. That is, 5, 4, 2, and 6 are less than or equal to 5, 5, 5, and 7 respectively. Stencil 31 is a match if the final symbol is omitted (for inclusion in another packet), in 5, 4, and 2 are less than or equal to 8, 8, and 8. In some cases, only the worst-case stencil will match.

The most compact stencil of the matches is then chosen as the stencil for the packet. If there are multiple equally compact matches, any may be chosen.

In some cases, multiple configurations may be tested in parallel. For example, at step 1102, instead of selecting just one set of symbols, multiple sets of symbols can be selected. The stencil configuration providing the most compact result from among all the parallel tests may be chosen.

Determining a Stencil Dictionary

There is a tradeoff between optimal stencil patterns and minimizing stencil symbol count. Thus in some embodiments, all occurrences of all bit width sequences in the codec training data may be made, along with the number of bits each stencil encodes. The system then searches all combinations of subset and symmetrical stencil patterns to find an optimal configuration of stencil masks that maximizes overall compression.

For real-time parallel processing, data may be packed into constant bit width packets. These packets may require a small constant width header to indicate which stencil applies to that packet. Because the packets are a constant width, there is an inherent additional consideration on how to choose optimal stencils. More stencils provide more flexibility, but requires a larger header. If the header is larger than the number of stencils warrants, this results in reduced compression.

Thus in some embodiments, a determination is made of a packet header size to maximize compression. This is to maximize compression based on the number of stencils and the packet header size needed.

Since there is no reason to waste possible encoding bits, the header size may be more optimal if it is wider allowing for a larger selection of stencils, or all stencil patterns chosen may be tested for wider widths such that they perfectly fit the available data packets without wasting encoding opportunities. For example, an encoding packet may have 21 bits available to contain symbols, but the optimal computed stencils may only need 20 bits. In this case various permutations of the optimal stencils may be calculated as wider bit widths to find the ones that benefit most from the extra encoding bit. For example, where an optimal stencil is {5, 5, 5, 5}, the set of {6, 5, 5, 5}, {5, 6, 5, 5}, {5, 5, 6, 5} and {5, 5, 5, 6} may be tested to find the 21 bit stencil with the most additional encoding potential.

Stencil Symmetries

In practice many stencil patterns may be shifted symmetries of one another that are simply out of alignment during encoding. For example, a {5, 5, 6, 5} stencil is a shifted {6, 5, 5, 5} stencil. Stencils may also be repetition symmetries of one another. For example, {6, 5, 6, 5} is a superset of a {6, 5} stencil and a shifted symmetry of a {5, 6, 5, 6} stencil. A {4, 4, 4, 4} stencil is a subset of a {6, 5, 6, 5} stencil.

In some embodiments, the stencil dictionary is searched for these symmetries to determine if there are encoding efficiencies to be gained by recognizing them and grouping symmetry related stencils together. This grouping may occur by representing the stencils as parameters of a single stencil function. This may reduce the size of the overall stencil list.

To improve the speed of detection and matching of stencil symmetries, a given stencil pattern may be assigned a hash code that is computed from all of its related symmetries. Hence all symmetries of a given stencil pattern will hash to the same value. The applied stencil assigned to that hash code may correspond to a single superset stencil that encodes all of the possible symmetries found in the actual data stream.

For example, a {5, 5, 6, 6}, a {5, 6, 5, 6} and a {6, 5, 6, 5} stencil would all hash to the same value and be matched with a {6, 6, 6, 6} stencil that was a superset of all of them.

Figure 12:
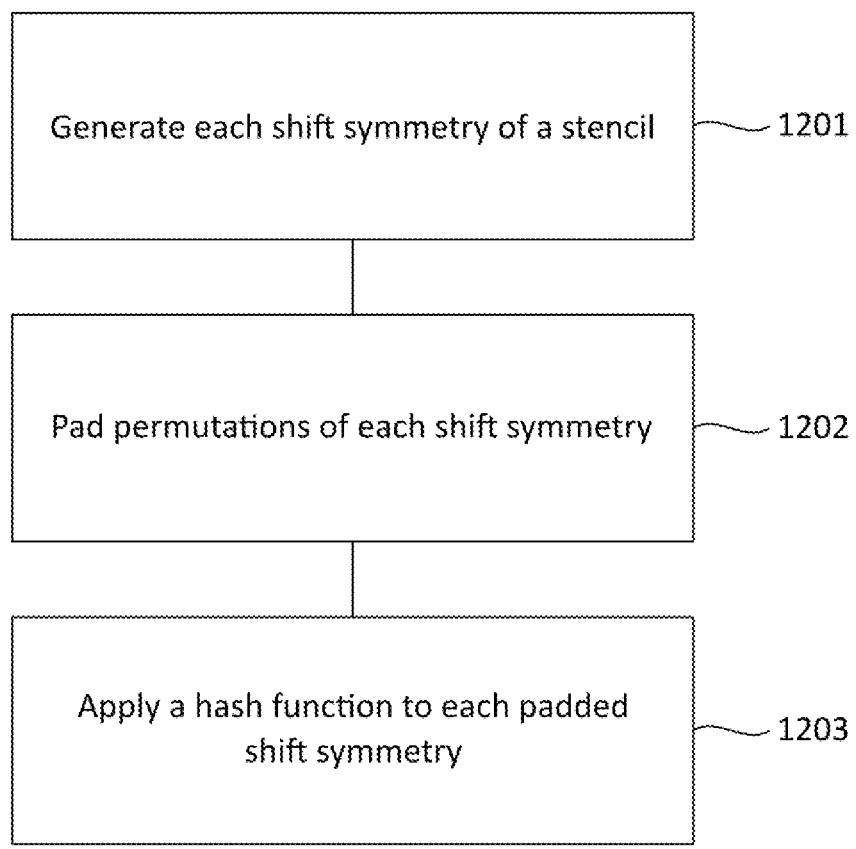
FIG. 12 illustrates an example approach for using stencil symmetries.

FIG. 12 is an example approach for using stencil symmetries.

At step 1201, each shift symmetry of a given stencil is generated. For example, for a stencil {4, 5, 2, 2, 4, 4, 2}, there are 6 shift symmetries: {5, 2, 2, 4, 4, 2, 4}, {2, 2, 4, 4, 2, 4, 5}, {2, 4, 4, 2, 4, 5, 2}, {4, 4, 2, 4, 5, 2, 2}, {4, 2, 4, 5, 2, 2, 4}, and {2, 4, 5, 2, 2, 4, 4}.

At step 1202, permutations of each shift symmetry are padded to the number of total available bits for the data. For example, the stencil {4, 5, 2, 2, 4, 4, 2} requires 23 bits. If the packet size allowed for 27 bits of data, the additional 4 bits can be distributed across the stencil in many different ways. For example, {8, 5, 2, 2, 4, 4, 2} or {5, 6, 3, 3, 4, 4, 2}.

At step 1203, a hash function is applied to each padded shift symmetry. All of these hashes are then hashed into a single value.

The hash value can then be used to quickly determine if a stencil sequence is a symmetry of the original stencil, since they will hash to the same value. That is, the result of a hash function of {5, 2, 3, 4, 4, 4, 4} will be the same as the result of a hash function of {4, 5, 2, 2, 4, 4, 2}.

Differential Stencils

Additional compression may be achieved by subtracting a constant value or set of values, or a data sequence to further reduce its bit count. For example, the sequence {8, 17, 4, 19} can have the value 4 subtracted from every value in the sequence. This reduces every value by at least 1 bit. After subtraction, this sequence goes from requiring 17 bits to encode to 11 bits to encode. This saves 6 bits in size, though the subtraction stencil requires some additional packet header data to store. In a further example, a {8, 8, 4, 8} differential stencil may achieve more compression at the expense of requiring an additional entry in the stencil dictionary to store the more specialized differential stencil pattern.

In some embodiments other rules may also be applied to stencils to improve their compression, such as masking the first, last, or middle n set bits of every field.

Figure 13:
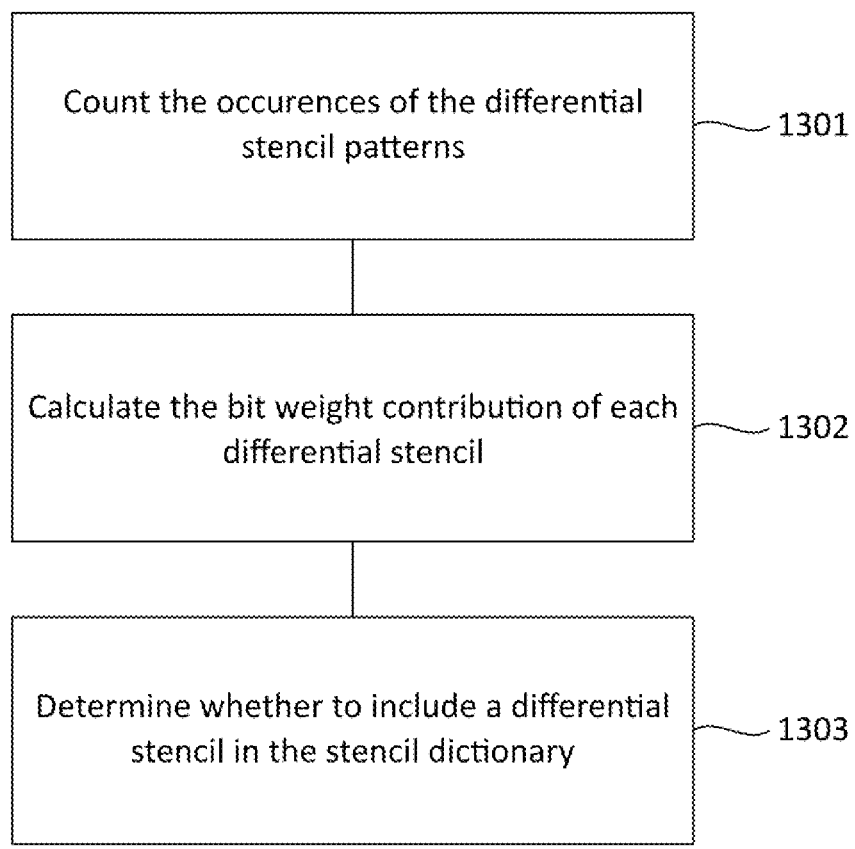
FIG. 13 illustrates an example approach for determining differential stencils.

FIG. 13 shows an example approach to determining an optimal set of differential stencils.

At step 1301, a count of the occurrences of all differential stencil patterns is generated.

At step 1302, the bit weight contribution of each differential stencil to the data sample being compressed is calculated.

At step 1303, the differential stencil is included in the stencil dictionary based on optimizing savings in data size as a combination of the size of the stencil list combined with the total bit savings achieved.

Decoding

Figure 14:
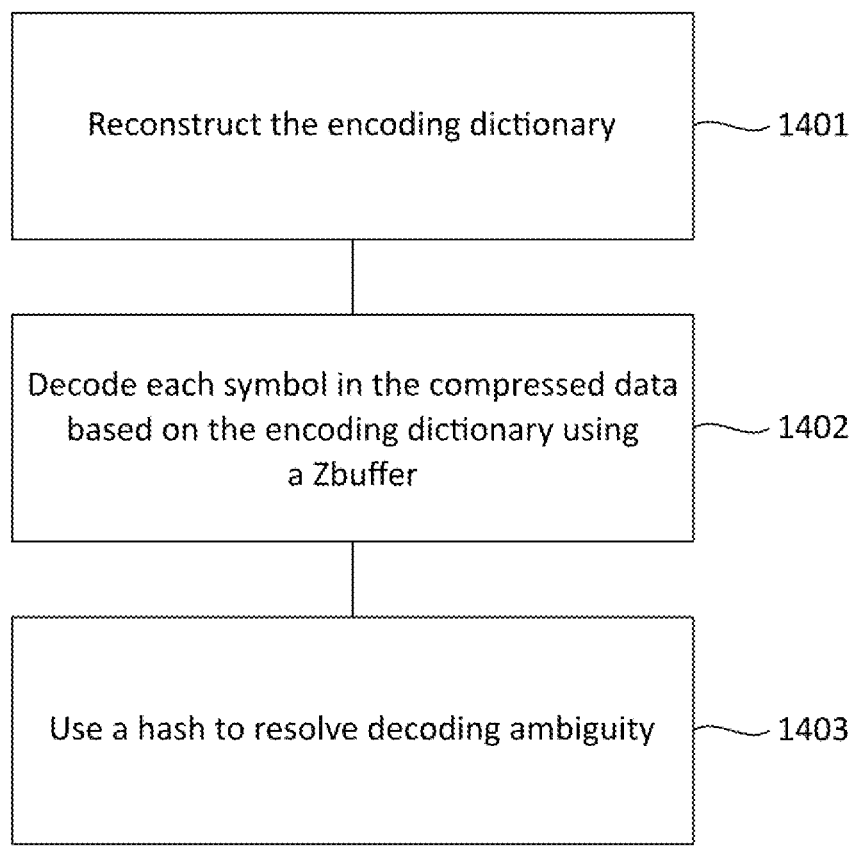
FIG. 14 illustrates an example approach for decoding data that was encoded used dictionary-based compression according to one embodiment.

FIG. 14 shows an example of decoding data that has been encoded using methods described above.

At step 1401, the encoding dictionary is reconstructed based on a base dictionary and adaptive differences encoded with the compressed data.

At step 1402, each symbol in the compressed data is compared to the dictionary to decode the pattern into a Zbuffer. This uses the dictionary's decoding and overlap rules.

At step 1403, if the decoding rules included ambiguity, all permutations of possible interpretations are decoded, and the decoded output that hashes to the same cryptographic hash as the input data is selected.

In some embodiments a Zbuffer may be used to perform decoding of the encoded data by decoding each pattern into the Zbuffer at the depth of its dictionary index. If overlapping patterns are not permitted each pattern is encoded at the bit position that the preceding pattern ended on. If overlapping is allowed additional information about how patterns in the dictionary overlap one another may be pre-computed to accelerate decompression and stored as decoding rules with the codec.

Once the encoded data stream is decoded to the Zbuffer it can be rendered and tested against its hash code to confirm that it was correctly decompressed.

System

Figure 15:
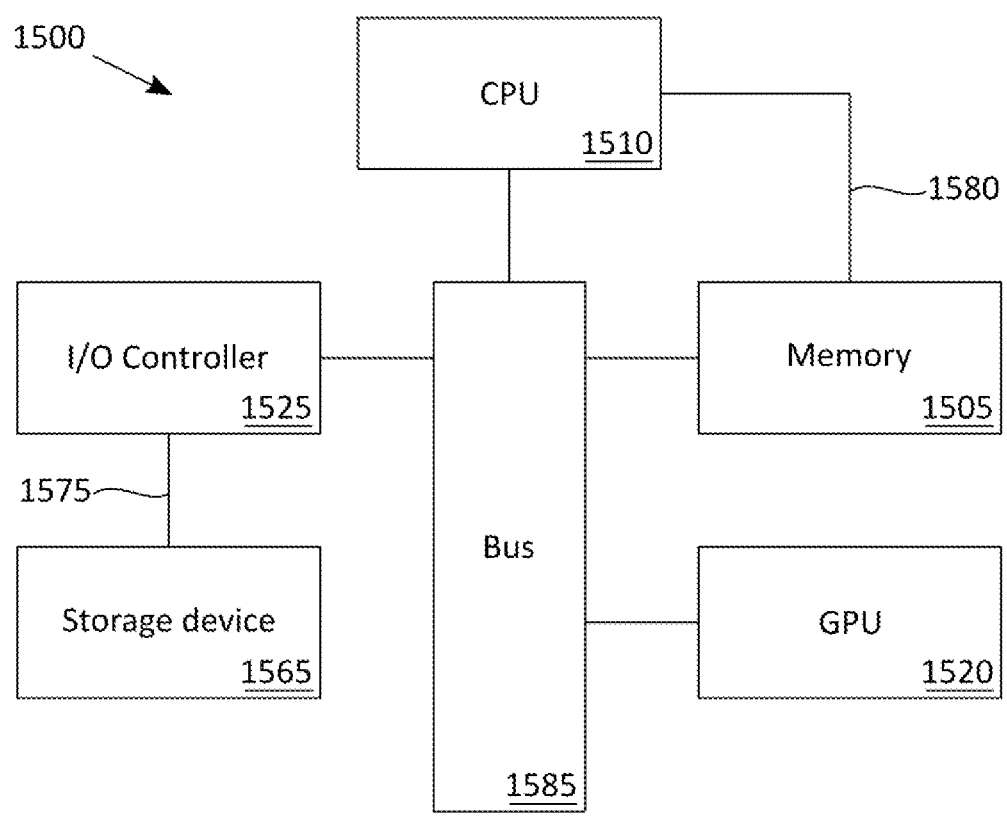
FIG. 15 shows an example system for performing one of more methods.

FIG. 15 shows a block diagram of an example compression system 1500. The compression system 1500 includes a main memory 1505, a central processing unit (CPU) 1510, a graphics processing unit (GPU) 1520. The system 1500 may further include a plurality of storage devices 1565, which are connected via a bus 1575 to an I/O processor 1525.

CPU 1510, GPU 1520, and the I/O processor 1525 communicate via a system bus 1585. Further, the CPU 1510 communicates with the main memory 1505 via a dedicated bus 1580.

It should be appreciated that embodiments of the approaches described above can be implemented in numerous ways, including as processes, apparatus, systems, devices, methods, computer readable media, computational algorithms, embedded or distributed software and/or as a combination thereof.

In some embodiments, apparatuses are implemented as a field-programmable gate array (FPGA) or an application-specific integrated circuit (ASIC).

The various embodiments can be implemented in a wide variety of operating environments, which in some cases can include one or more user computers, computing devices, or processing devices which can be used to operate any of a number of applications. User or client devices can include any of a number of general purpose personal computers, such as desktop or laptop computers running a standard operating system, as well as cellular, wireless, and handheld devices running mobile software and capable of supporting a number of networking and messaging protocols. Such a system also can include a number of workstations running any of a variety of commercially-available operating systems and other known applications for purposes such as development and database management. These devices also can include other electronic devices, such as dummy terminals, thin-clients, video terminals and other devices capable of communicating via a network.

Various aspects also can be implemented as part of at least one service or Web service, such as may be part of a service-oriented architecture. Services such as Web services can communicate using any appropriate type of messaging, such as by using messages in extensible markup language (XML) format and exchanged using an appropriate protocol such as SOAP ("Simple Object Access Protocol"). Processes provided or executed by such services can be written in any appropriate language, such as the Web Services Description Language (WSDL). Using a language such as WSDL allows for functionality such as the automated generation of client-side code in various SOAP frameworks.

Some embodiments utilize at least one network that would be familiar to those skilled in the art for supporting communications using any of a variety of commercially-available protocols, such as TCP/IP, OSI, FTP, UPnP, NFS, and CIFS. The network can be, for example, a local area network, a wide-area network, a virtual private network, the Internet, an intranet, an extranet, a public switched telephone network, an infrared network, a wireless network, and any combination thereof.

In embodiments utilizing a Web server, the Web server can run any of a variety of server or mid-tier applications, including HTTP servers, FTP servers, CGI servers, data servers, Java servers, and business map servers. The server(s) also may be capable of executing programs or scripts in response requests from user devices, such as by executing one or more Web applications that may be implemented as one or more scripts or programs written in any programming language, such as Java, C, C # or C++, or any scripting language, such as Perl, Python, or TCL, as well as combinations thereof. The server(s) may also include database servers, including without limitation those commercially available from Oracle, Microsoft, Sybase, and IBM.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers, or other network devices may be stored locally and/or remotely, as appropriate. Where a system includes computerized devices, each such device can include hardware elements that may be electrically coupled via a bus, the elements including, for example, at least one central processing unit (CPU), at least one input device (such as a mouse, keyboard, controller, touch screen, or keypad), and at least one output device (such as a display device, printer, or speaker). Such a system may also include one or more storage devices, such as disk drives, optical storage devices, and solid-state storage devices such as random-access memory ("RAM") or read-only memory ("ROM"), as well as removable media devices, memory cards, flash cards, etc.

Such devices also can include a computer-readable storage media reader, a communications device (such as a modem, a network card (wireless or wired), an infrared communication device, etc.), and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services, or other elements located within at least one working memory device, including an operating system and application programs, such as a client application or Web browser. It should be appreciated that alternate embodiments may have numerous variations from that described above. For example, customized hardware might also be used, and/or particular elements might be implemented in hardware, software (including portable software, such as applets), or both. Further, connection to other computing devices such as network input/output devices may be employed.

Storage media and computer readable media for containing code, or portions of code, can include any appropriate media known or used in the art, including storage media and communication media, such as but not limited to volatile and non-volatile, removable and non-removable media implemented in any method or technology for storage and/or transmission of information such as computer readable instructions, data structures, program modules, or other data, including RAM, ROM, EEPROM, flash memory or other memory technology, CD-ROM, digital versatile disk (DVD) or other optical storage, magnetic cassettes, magnetic tape, magnetic disk storage or other magnetic storage devices, or any other medium which can be used to store the desired information and which can be accessed by the a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made without departing from the broader spirit and scope of the disclosure.

The description of the subject technology is provided to enable any person skilled in the art to practice the various embodiments described. While the subject technology has been particularly described with reference to the various figures and embodiments, it should be understood that these are for illustration purposes only and should not be taken as limiting the scope of the subject technology.

There may be many other ways to implement the subject technology. Various functions and elements described herein may be partitioned differently from those shown without departing from the scope of the subject technology. Various modifications to these embodiments will be readily apparent to those skilled in the art, and generic principles defined herein may be applied to other embodiments. Thus, many changes and modifications may be made to the subject technology, by one having ordinary skill in the art, without departing from the scope of the subject technology.

Interpretation

Reference to any prior art in this specification does not constitute an admission that such prior art forms part of the common general knowledge.

It is acknowledged that the terms "comprise", "comprises" and "comprising" may, under varying jurisdictions, be attributed with either an exclusive or an inclusive meaning. For the purpose of this specification, and unless otherwise noted, these terms are intended to have an inclusive meaning—that is, they will be taken to mean an inclusion of the listed components which the use directly references, and possibly also of other non-specified components or elements. A reference to an element in the singular is not intended to mean "one and only one" unless specifically stated, but rather "one or more". The term "some" refers to one or more. Headings and subheadings are used for convenience only, do not limit the subject technology, and are not referred to in connection with the interpretation of the description of the subject technology.

It is understood that any specific order or hierarchy of steps in the processes disclosed is an illustration of exemplary approaches. Based upon design preferences, it is understood that the specific order or hierarchy of steps in the processes may be rearranged, or that only a portion of the illustrated steps be performed. Some of the steps may be performed simultaneously. For example, in certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims.

While the present invention has been illustrated by the description of the embodiments thereof, and while the embodiments have been described in detail, it is not intended that these restrict or in any way limit the scope of the appended claims to such detail. Further, the above embodiments may be implemented individually, or may be combined where compatible. Additional advantages and modifications, including combinations of the above embodiments, will readily appear to those skilled in the art. Therefore, the invention in its broader aspects is not limited to the specific details, representative apparatus and methods, and illustrative examples shown and described. Accordingly, departures may be made from such details without departure from the spirit or scope of the general inventive concept.

The invention claimed is:

1. A computer-implemented method for compressing data, the method comprising:
    using a Zbuffer to perform a parallel dictionary generation process to generate a dictionary of phrases from sample data, the dictionary being configured for use in encoding unencoded data and/or decoding encoded data,
    wherein the parallel dictionary generation process comprises:
    computing a plurality of candidate patterns based on the likely contribution of each candidate pattern to compression of the sample data;
    calculating, in parallel, an actual contribution of each of the plurality of candidate patterns to the compression of the sample data;
    selecting the pattern having a highest calculated actual contribution;
    adding the selected pattern to the dictionary; and
    repeating the calculating, selecting, and adding until a termination condition is satisfied;
    wherein the Zbuffer is configured to handle occlusion of objects by storing the distance from a viewer for a set of rendered pixels.

2. The method of claim 1, wherein one or more phrases are overlapping occluded phrases.

3. The method of claim 2, wherein a plurality of lowest-ranking overlapping occluded phrases are preassigned, the method further comprising:
    using the Zbuffer to identify phrases that represent the uncompressed data; and
    accessing the resulting phrases to identify the phrases that best compress the data.

4. The method of claim 1, further comprising: using a stencil buffer in conjunction with the Zbuffer to store wildcard phrases within an occluding phrase.

5. The method of claim 4, wherein during processing the Zbuffer and stencil buffer interact such that where wildcards exist in a phrase, data of the phrase from a lower depth of the Zbuffer passes through.

6. The method of claim 1, further comprising: obtaining the phrases from a dictionary.

7. The method of claim 1, further comprising: generating the phrases from the data.

8. The method of claim 1, further comprising:
    determining that an identified phrase is not in the compression dictionary; and
    adding the phrase to the compression dictionary.

9. The method of claim 1, wherein a phrase is represented by a label and parameters, wherein the label references a function that takes the parameters.

10. The method of claim 1, wherein a phrase is represented by a hash code, the hash code corresponding to a plurality of functions.

11. An apparatus for compressing data, the apparatus comprising:
- a processor;
- memory associated with the processor; and
- a Zbuffer;
- wherein the Zbuffer is configured for use in the method of claim 1.

12. A non-transitory computer-readable medium comprising instructions which, when executed by a computer, cause the computer to perform the method of claim 1.

13. A computer-implemented method for decompressing compressed data comprising:
- using a Zbuffer to generate decompressed data by combining a set of overlapping occluded phrases from a predetermined dictionary of phrases,
- wherein using the Zbuffer to generate decompressed data by combining the set of overlapping occluded phrases from the predetermined dictionary of phrases comprises:
  - receiving encoded data, the encoded data being encoded using the predetermined dictionary of phrases and having at least two overlapping phrases;
  - computing, in parallel, a plurality of distinct permutations of the at least two overlapping phrases;
  - decoding, in parallel, the encoded data using each of the distinct permutations of the at least two overlapping phrases in the Zbuffer to produce a plurality of decompressed data, each decompressed data in the plurality of decompressed data corresponding to a permutation of the distinct permutations of the at least two overlapping phrases; and
  - identifying one decompressed data of the plurality of decompressed data as the correct decompressed data for the encoded data;
- wherein the Zbuffer is configured to handle occlusion of objects by storing the distance from a viewer for a set of rendered pixels.

14. The method of claim 13, further comprising: using a stencil buffer in conjunction with the Zbuffer to store wildcard phrases within an occluding phrase.

15. The method of claim 14, wherein during decompression the depth and stencil buffer interact such that where wildcard phrases exist in a phrase, data of the phrase from a lower depth of the Zbuffer passes through.

16. The method of claim 13, wherein the compressed data contains codewords, the method further comprising:
- obtaining the phrases by looking up the codewords in a dictionary.

17. The method of claim 16, wherein the codewords in the dictionary contain multiple phrases, and wherein the compressed data contains one or more checksums, the method further comprising:
- decompressing the compressed data in parallel using each phrase;
- calculating a checksum associated with the decompression;
- comparing the calculated checksum to the checksum contained in the compressed data; and
- determining which phrase to use based on the comparison.

18. The method of claim 13, further comprising: decompressing the compressed data by executing one or more functions, a function is referenced by a label and the function takes parameters, and wherein the compressed data contains the label and parameters.

19. An apparatus for decompressing compressed data comprising:
- a processor;
- memory associated with the processor; and
- a Zbuffer;
- wherein the Zbuffer is configured for use in the method of claim 13.

20. A non-transitory computer-readable medium comprising instructions which, when executed by a computer, cause the computer to perform the method of claim 13.

\* \* \* \* \*